(12) United States Patent
Yasunishi et al.

(10) Patent No.: US 11,011,607 B2
(45) Date of Patent: May 18, 2021

(54) METHOD OF MANUFACTURING SEMICONDUCTOR DEVICE

(71) Applicant: TOYODA GOSEI CO., LTD., Kiyosu (JP)

(72) Inventors: Kota Yasunishi, Kiyosu (JP); Toru Oka, Kiyosu (JP); Kazuya Hasegawa, Kiyosu (JP)

(73) Assignee: TOYODA GOSEI CO., LTD., Kiyosu (JP)

( * ) Notice: Subject to any disclaimer, the term of this patent is extended or adjusted under 35 U.S.C. 154(b) by 0 days.

(21) Appl. No.: 16/573,372

(22) Filed: Sep. 17, 2019

(65) Prior Publication Data

US 2020/0098872 A1    Mar. 26, 2020

(30) Foreign Application Priority Data

Sep. 25, 2018   (JP) .............................. JP2018-178966

(51) Int. Cl.
*H01L 29/66*     (2006.01)
*H01L 29/20*     (2006.01)
*H01L 29/872*    (2006.01)

(52) U.S. Cl.
CPC .... *H01L 29/2003* (2013.01); *H01L 29/66143* (2013.01); *H01L 29/66212* (2013.01); *H01L 29/872* (2013.01)

(58) Field of Classification Search
CPC ......... H01L 29/06; H01L 29/04; H01L 29/20; H01L 29/24; H01L 29/34; H01L 29/66; H01L 29/0657; H01L 29/0619; H01L 29/66143; H01L 29/66212; H01L 29/47; H01L 29/86; H01L 29/872;
(Continued)

(56) References Cited

U.S. PATENT DOCUMENTS 5,614,749 A * 3/1997 Ueno ................ H01L 29/41766
257/330
10,276,731 B2 * 4/2019 Hasegawa ........... H01L 21/0495
(Continued)

FOREIGN PATENT DOCUMENTS

JP    2007-048783 A    2/2007
JP    2018-032828 A    3/2018

*Primary Examiner* — Chuong A Luu
(74) *Attorney, Agent, or Firm* — McGinn I.P. Law Group, PLLC

(57) ABSTRACT

The likelihood of formation of a corner resulting from a recess in a part of an n-type semiconductor layer is reduced at a deeper position than a p-type semiconductor layer. A method of manufacturing a semiconductor device comprises: forming a gallium nitride (GaN) based n-type semiconductor layer containing n-type impurities; forming a groove by forming a first mask on a part of a surface of the n-type semiconductor layer and then etching a part uncovered by the first mask; removing the first mask; forming a gallium nitride (GaN) based p-type semiconductor layer containing p-type impurities on the surface of the n-type semiconductor layer including the groove; etching the p-type semiconductor layer so as to expose the n-type semiconductor layer at least in a range differing from a range in the presence of the groove; and forming a metal electrode contacting the exposed n-type semiconductor layer and the p-type semiconductor layer.

20 Claims, 29 Drawing Sheets

(58) Field of Classification Search
CPC .............. H01L 29/2003; H01L 29/868; H01L 29/0623; H01L 29/778; H01L 29/15; H01L 29/205; H01L 29/207; H01L 29/7786; H01L 29/157; H01L 29/66462; H01L 29/8613; H01L 29/7813; H01L 29/4236; H01L 29/66204; H01L 29/41766; H01L 29/7788; H01L 29/66734; H01L 33/38; H01L 33/387; H01L 21/02; H01L 21/06; H01L 21/306; H01L 21/0254; H01L 21/02579; H01L 21/30612; H01L 21/0262; H01L 21/266; H01L 21/02631; H01L 21/3245; H01L 21/26546; H01L 21/26586; H01L 21/26553
USPC .......................................................... 438/77
See application file for complete search history.

(56) References Cited

U.S. PATENT DOCUMENTS

| | | | |
|---|---|---|---|
| 10,332,754 B2* | 6/2019 | Niwa | H01L 21/0254 |
| 2006/0060895 A1* | 3/2006 | Hikita | H01L 29/41766 257/280 |
| 2007/0029633 A1 | 2/2007 | Hirose et al. | |
| 2007/0235768 A1* | 10/2007 | Nakazawa | H01L 29/66212 257/211 |
| 2009/0154210 A1* | 6/2009 | Fujikawa | H01L 29/66901 363/163 |
| 2009/0283776 A1* | 11/2009 | Iwamuro | H01L 29/7811 257/76 |
| 2012/0241762 A1* | 9/2012 | Noda | H01L 29/872 257/77 |
| 2013/0001585 A1* | 1/2013 | Tsuchiya | H01L 29/861 257/76 |
| 2013/0001703 A1* | 1/2013 | Sugawara | H01L 29/0657 257/378 |
| 2013/0032821 A1* | 2/2013 | Lee | H01L 29/1608 257/77 |
| 2013/0126885 A1* | 5/2013 | Disney | H01L 21/266 257/76 |
| 2013/0140584 A1* | 6/2013 | Kameshiro | H01L 29/66143 257/77 |
| 2013/0168698 A1* | 7/2013 | Lee | H01L 29/66068 257/77 |
| 2014/0048902 A1* | 2/2014 | Raj | H01L 21/0254 257/472 |
| 2014/0225120 A1* | 8/2014 | Zhu | H01L 29/2003 257/76 |
| 2014/0312355 A1* | 10/2014 | Kizilyalli | H01L 29/868 257/76 |
| 2014/0374790 A1* | 12/2014 | Jin | H01L 21/26513 257/121 |
| 2015/0069414 A1* | 3/2015 | Kono | H01L 29/0688 257/77 |
| 2016/0005835 A1* | 1/2016 | Kizilyalli | H01L 29/66212 438/494 |
| 2016/0079413 A1* | 3/2016 | Kono | H01L 29/1608 257/330 |
| 2016/0268448 A1* | 9/2016 | Minamisawa | H01L 29/66143 |
| 2017/0033098 A1* | 2/2017 | He | H01L 29/205 |
| 2017/0200790 A1* | 7/2017 | Hitora | H01L 21/02573 |
| 2017/0256657 A1* | 9/2017 | Niwa | H01L 29/0657 |
| 2017/0278719 A1* | 9/2017 | Fujii | H01L 29/872 |
| 2018/0097063 A1* | 4/2018 | Matsuyama | H01L 29/1095 |
| 2018/0182853 A9* | 6/2018 | Zhu | H01L 29/2003 |
| 2018/0218910 A1* | 8/2018 | Harada | H01L 29/0684 |
| 2018/0261673 A1* | 9/2018 | Tanaka | H01L 29/41741 |
| 2018/0286684 A1* | 10/2018 | Fujii | H01L 21/0262 |
| 2019/0074385 A1* | 3/2019 | Lee | H01L 29/08 |
| 2019/0157448 A1* | 5/2019 | Takashima | H01L 29/2003 |
| 2019/0189808 A1 | 6/2019 | Mishima et al. | |
| 2019/0228971 A1* | 7/2019 | Iguchi | H01L 29/861 |
| 2019/0267486 A1* | 8/2019 | Ueno | H01L 29/7806 |
| 2019/0305114 A1* | 10/2019 | Niwa | H01L 23/544 |
| 2020/0105917 A1* | 4/2020 | Okita | H01L 29/2003 |
| 2020/0127100 A1* | 4/2020 | Narita | H01L 29/36 |
| 2020/0152805 A1* | 5/2020 | Sugimoto | H01L 29/47 |

* cited by examiner

Fig.3
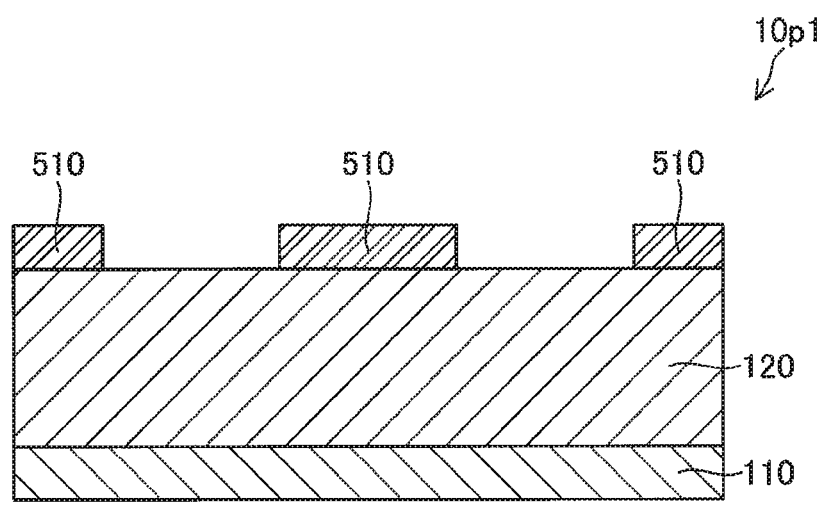
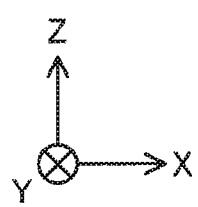

Fig.11
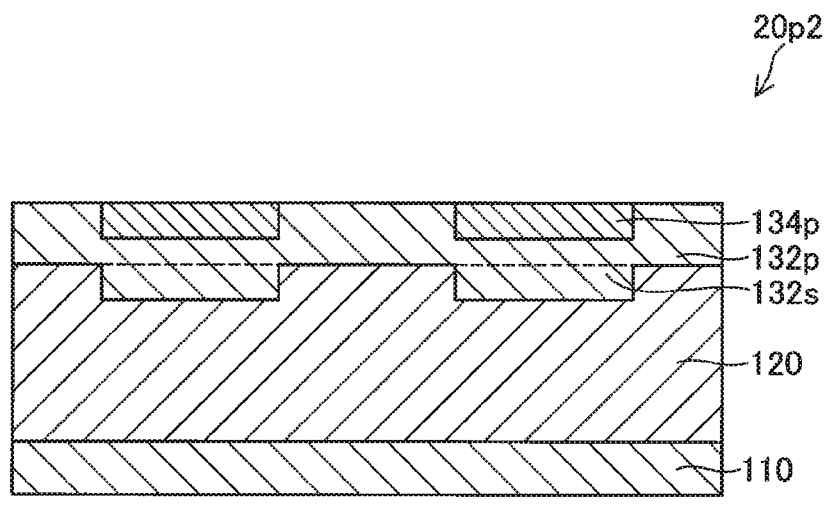
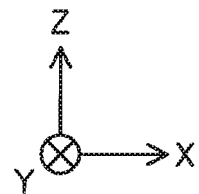

Fig.22
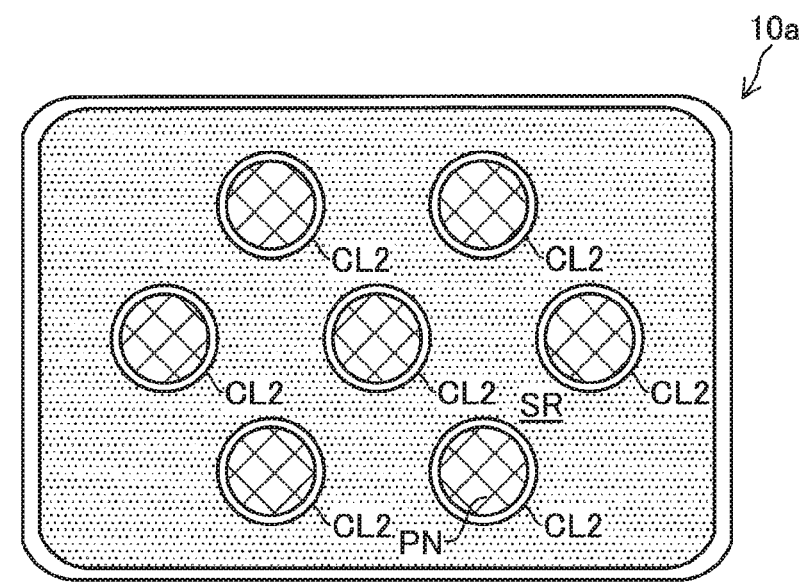
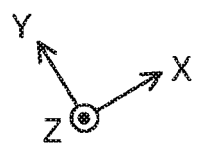

METHOD OF MANUFACTURING SEMICONDUCTOR DEVICE

CROSS REFERENCE TO RELATED APPLICATIONS

The present application claims the priority based on Japanese Patent Application No. 2018-178966 filed on Sep. 25, 2018, the disclosure of which is hereby incorporated by reference in its entirety.

BACKGROUND

Field

The present disclosure relates to a method of manufacturing a semiconductor device.

Related Art

Some semiconductor devices have a junction barrier Schottky diode structure in which a pn junction diode and a Schottky barrier diode are provided in parallel. One method of manufacturing such a semiconductor device in Japanese Patent Application Publication No. 2007-48783A includes a process of stacking an n-type semiconductor layer containing n-type impurities and a p-type semiconductor layer containing p-type impurities, and then removing a part of the p-type semiconductor layer by etching to an interface between the n-type semiconductor layer and the p-type semiconductor layer to expose the n-type semiconductor layer.

According to the manufacturing method of JP2007-48783A, it is technically difficult to perform etching precisely to the interface between the n-type semiconductor layer and the p-type semiconductor layer. Hence, etching may proceed further into the n-type semiconductor layer than the interface. As a result, in some cases, a part of the n-type semiconductor layer at a deeper position than the p-type semiconductor layer is recessed to form a corner. In such cases, electric field crowding may occur at this corner to cause the risk of increase in reverse leakage current. To address this problem, a method of manufacturing a semiconductor device having a junction barrier Schottky diode structure has been desired to employ a technique capable of reducing the likelihood of formation of a corner resulting from a recess in a part of the n-type semiconductor layer at a deeper position than the p-type semiconductor layer.

SUMMARY

The present disclosure is feasible in the following aspects.

According to one aspect of the present disclosure, a method of manufacturing a semiconductor device is provided. The method of manufacturing the semiconductor device comprises: forming a gallium nitride (GaN) based n-type semiconductor layer containing n-type impurities; forming a groove by forming a first mask on a part of a surface of the n-type semiconductor layer and then etching a part of the n-type semiconductor layer that is uncovered by the first mask; removing the first mask; forming a gallium nitride (GaN) based p-type semiconductor layer containing p-type impurities on the surface of the n-type semiconductor layer including the groove after removal of the first mask; etching the p-type semiconductor layer to expose the n-type semiconductor layer at least in a range differing from a range in the presence of the groove; and forming a metal electrode contacting the n-type semiconductor layer exposed by the etching of the p-type semiconductor layer and the p-type semiconductor layer.

BRIEF DESCRIPTION OF THE DRAWINGS

FIGS. 3 to 6 are sectional views each showing the configuration of the semiconductor device being manufactured;

FIGS. 10 to 12 are sectional views each showing the configuration of the semiconductor device being manufactured;

FIGS. 21 to 26 are schematic views each showing a cell structure in a semiconductor device;

DETAILED DESCRIPTION

A. First Embodiment

A-1. Configuration of Semiconductor Device

Figure 1:
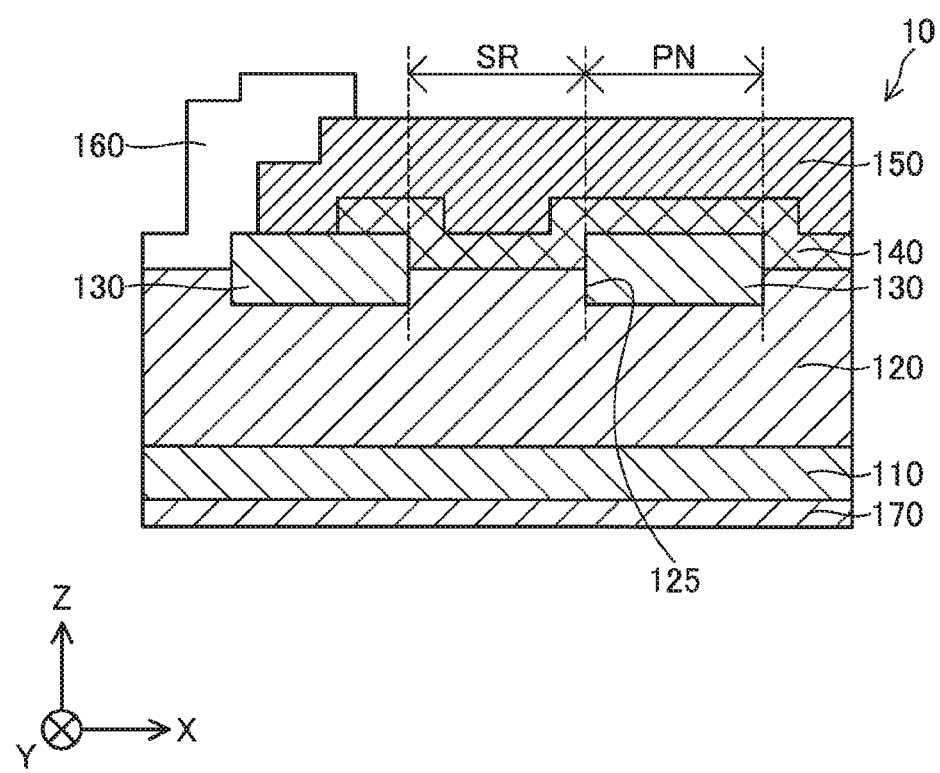
FIG. 1 is a sectional view showing a semiconductor device manufactured by a manufacturing method of a first embodiment.

FIG. 1 is a sectional view schematically showing the configuration of a semiconductor device 10 manufactured by a manufacturing method of a first embodiment. FIG. 1 shows a terminal part of the semiconductor device 10 toward a −X axis direction. Schematic views shown in FIG. 1. and its subsequent drawings are illustrated for showing the technical features of the semiconductor device 10 intelligibly, and the dimensions of each part are not shown correctly in these schematic views. To facilitate illustration, FIG. 1 shows an X axis, a Y axis, and a Z axis substantially orthogonal to each other. The X axis is an axis extending from the left toward the right of the plane of the sheet of FIG. 1. The Y axis is an axis extending from the front toward the back of the plane of the sheet of FIG. 1. The Z axis is an axis extending from the bottom to the top of the plane of the sheet of FIG. 1. The X, Y, and Z axes in other drawings correspond to the X, Y, and Z axis in FIG. 1. In this specification, the +direction of the Z axis may be called "upper" for convenience. This expression "upper" is not to limit the arrangement (orientation) of the semiconductor device 10. Namely, the semiconductor device 10 may be arranged in any orientation.

The semiconductor device 10 is a GaN-based semiconductor device formed using gallium nitride (GaN). In the first embodiment, the semiconductor device 10 has a junction barrier Schottky diode structure. FIG. 1 shows a Schottky region SR and a pn region PN. In the first embodiment, the semiconductor device 10 is used for power control and is also called a power device. The semiconductor device 10 includes a substrate 110, an n-type semiconductor layer 120, a groove 125, a p-type semiconductor layer 130, a metal electrode 140, a wiring electrode 150, a surface protective film 160, and a back side electrode 170.

The substrate 110 and the n-type semiconductor layer 120 are plate-like semiconductors extending along the X axis and the Y axis. In the first embodiment, the substrate 110 and the n-type semiconductor layer 120 are gallium nitride (GaN) based semiconductors. Examples of the gallium nitride (GaN) based semiconductors include not only gallium nitride (GaN) but also aluminum gallium nitride (AlGaN), indium gallium nitride (InGaN), and indium aluminum gallium nitride (InAlGaN). In terms of being used in semiconductor devices for power control, gallium nitride (GaN) and aluminum gallium nitride (AlGaN) are preferred. In the first embodiment, gallium nitride (GaN) is used. Gallium nitride (GaN) may partially be replaced by other Group III elements such as aluminum (Al) and indium (In) or may contain other impurities within a range in which the effect of the first embodiment is achieved.

The substrate 110 is a semiconductor containing n-type impurities. The substrate 110 is an n-type semiconductor having n-type characteristics. The substrate 110 contains silicon (Si) as n-type impurities. A silicon (Si) concentration in the substrate 110 is 1E18 $cm^{-3}$. The expression 1E18 means $1 \times 10^{18}$. In other embodiments, a silicon (Si) concentration in the substrate 110 is selectable from any value in a range from 1E18 to 1E20 $cm^{-3}$. In other embodiments, the substrate 110 may contain other n-type impurities such as germanium (Ge) or oxygen (O).

The n-type semiconductor layer 120 is located on the substrate 110. The n-type semiconductor layer 120 is a semiconductor containing n-type impurities. The n-type semiconductor layer 120 contains silicon (Si) as n-type impurities. A silicon (Si) concentration in the n-type semiconductor layer 120 is 1E16 $cm^{-3}$. In other embodiments, a silicon (Si) concentration in the n-type semiconductor layer 120 is selectable from any value in a range from 1E15 $cm^{-3}$ to 1E17 $cm^{-3}$. In other embodiments, the n-type semiconductor layer 120 may contain other n-type impurities such as germanium (Ge) or oxygen (O).

The groove 125 is a groove having a bottom located in the n-type semiconductor layer 120. The groove 125 is a structure formed by dry etching on the n-type semiconductor layer 120. The groove 125 has a depth of 1.0 µm. In other embodiments, the depth of the groove 125 is selectable from any value in a range of 0.1 or more and 3.0 µm or less.

The p-type semiconductor layer 130 is located on the groove 125 in the n-type semiconductor layer 120. The p-type semiconductor layer 130 is a semiconductor containing p-type impurities. The p-type semiconductor layer 130 contains magnesium (Mg) as p-type impurities. A magnesium (Mg) concentration in the p-type semiconductor layer 130 is 1E19 $cm^{-3}$. In other embodiments, a magnesium (Mg) concentration in the p-type semiconductor layer 130 is selectable from any value in a range from 1E17 to 1E22 $cm^{-3}$. In other embodiments, the p-type semiconductor layer 130 may contain any of zinc (Zn), beryllium (Be), and calcium (Ca) as p-type impurities.

The metal electrode 140 is arranged on the n-type semiconductor layer 120 and the p-type semiconductor layer 130. In a terminal part of the semiconductor device 10 toward each of the +X axis direction and the −X axis direction, the metal electrode 140 is arranged on a part of the p-type semiconductor layer 130. The metal electrode 140 is an electrode in Schottky junction with the n-type semiconductor layer 120. The electrode in Schottky junction mentioned herein means an electrode that produces a difference of 0.5 eV or more between the electron affinity of the n-type semiconductor layer 120 and the work function of metal used as the metal electrode 140. The metal electrode 140 is formed by stacking nickel (Ni) of a thickness of 100 nm and palladium (Pd) of a thickness of 100 nm in this order as viewed from the −Z axis direction. The thickness mentioned herein means a length in the Z axis direction. In other embodiments, the metal electrode 140 may be configured as a single layer containing at least one of nickel (Ni), palladium (Pd), platinum (Pt), and iridium (Ir), or configured by stacking metals selected from these metals.

The wiring electrode 150 is arranged on the metal electrode 140 and a part of the p-type semiconductor layer 130. The wiring electrode 150 is formed by stacking titanium nitride (TiN) of a thickness of 35 nm and an Al—Si based alloy of a thickness of 2000 nm in this order as viewed from the −Z axis direction. In other embodiments, the wiring electrode 150 may be configured to contain at least one of aluminum (Al), an Al—Cu based alloy, an Al—Si—Cu based alloy, gold (Au), and copper (Cu). The wiring electrode 150 is an anode electrode electrically connected to the metal electrode 140.

In a terminal part of the semiconductor device 10 toward each of the +X axis direction and the −X axis direction, the surface protective film 160 is arranged on a part of the wiring electrode 150 and a part of the p-type semiconductor layer 130. The surface protective film 160 is a film having electrically insulating properties. The surface protective film 160 is made of silicon nitride (SiN) of a thickness of 500 nm. In other embodiments, the surface protective film 160 may be configured by stacking silicon oxide ($SiO_2$) on silicon nitride, or may be made of an oxynitride containing silicon (Si) or polyimide.

The back side electrode 170 is an electrode in ohmic contact to the substrate 110 toward the −Z axis direction. The back side electrode 170 is formed by stacking titanium (Ti) of a thickness of 30 nm and an Al—Si based alloy of a thickness of 300 nm in this order as viewed from the +Z axis direction, and then alloying the stacked metals by thermal treatment. A temperature of the thermal treatment is 450° C. In other embodiments, a temperature of the thermal treatment is selectable from any value from 350 to 550° C. Time of the thermal treatment is 30 minutes. In other embodiments, time of the thermal treatment is selectable from any value from five to 60 minutes. In other embodiments, a surface of the back side electrode 170 toward the −Z axis direction may be a deposited film of silver (Ag), or a barrier metal layer made of titanium nitride (TiN) may be stacked on this surface. The back side electrode 170 functions as a cathode electrode of the semiconductor device 10 as a junction barrier Schottky diode.

A-2. Method of Manufacturing Semiconductor Device

Figure 2:
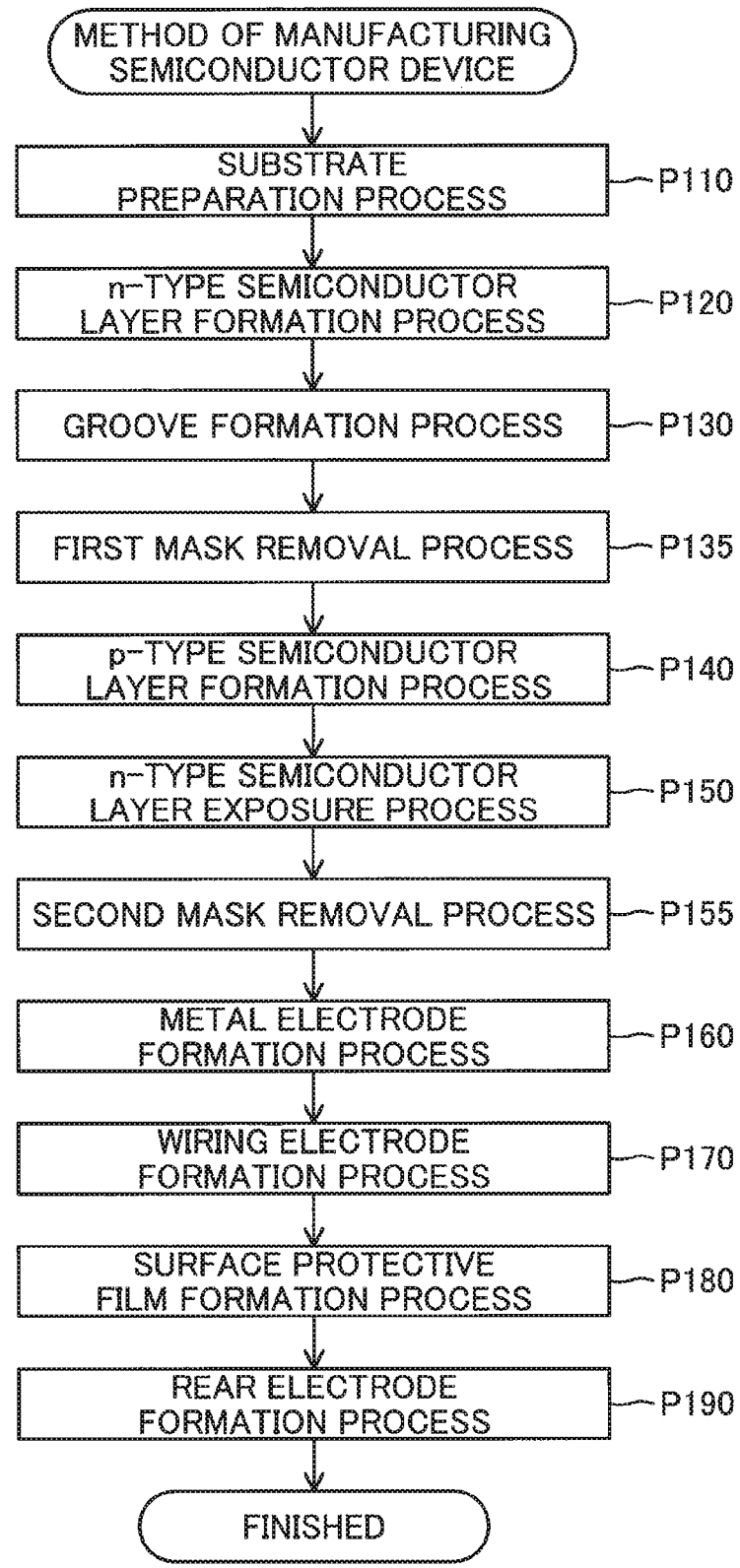
FIG. 2 is a process chart showing the manufacturing method of the first embodiment.

FIG. 2 is a process chart showing a method of manufacturing the semiconductor device 10. FIG. 3 is a sectional view schematically showing the configuration of a semiconductor device 10p1 being manufactured. FIG. 3 shows the configuration of the semiconductor device 10p1 with first masks 510 formed during process P130 after implementation of process P110 and process P120 shown in FIG. 2. First, a manufacturer performs a substrate preparation process of preparing the substrate 110 (process P110). Next, the manufacturer performs a p-type semiconductor layer formation process (process P120). In the n-type semiconductor layer formation process (process P120), the n-type semiconductor layer 120 is formed on the substrate 110. The manufacturer performs the n-type semiconductor layer formation process (process P120) using metal organic chemical vapor deposition (MOCVD) technique. After the n-type semiconductor layer formation process (process P120), the manufacturer performs a groove formation process (process P130). In the groove formation process (process P130), the manufacturer forms the first masks 510 on parts of a surface of the n-type semiconductor layer 120 and then dry etches a part uncovered by the first masks 510, thereby forming the groove 125. In the first embodiment, the dry etching is performed using Cl-based etching gas.

In the semiconductor device 10p1 shown in FIG. 3, the n-type semiconductor layer 120 is formed on the substrate 110 as a result of implementation of process P110 and process P120. In the semiconductor device 10p1, the first masks 510 are formed at an interval on parts of the surface of the n-type semiconductor layer 120 toward the +Z axis direction as a preparatory process for the dry etching in process P130. The groove 125 is formed at a position of the n-type semiconductor layer 120 corresponding to this interval. After the dry etching, wet etching may be performed using an alkaline solution such as tetramethyl ammonium hydroxide (TMAH).

Figure 4:
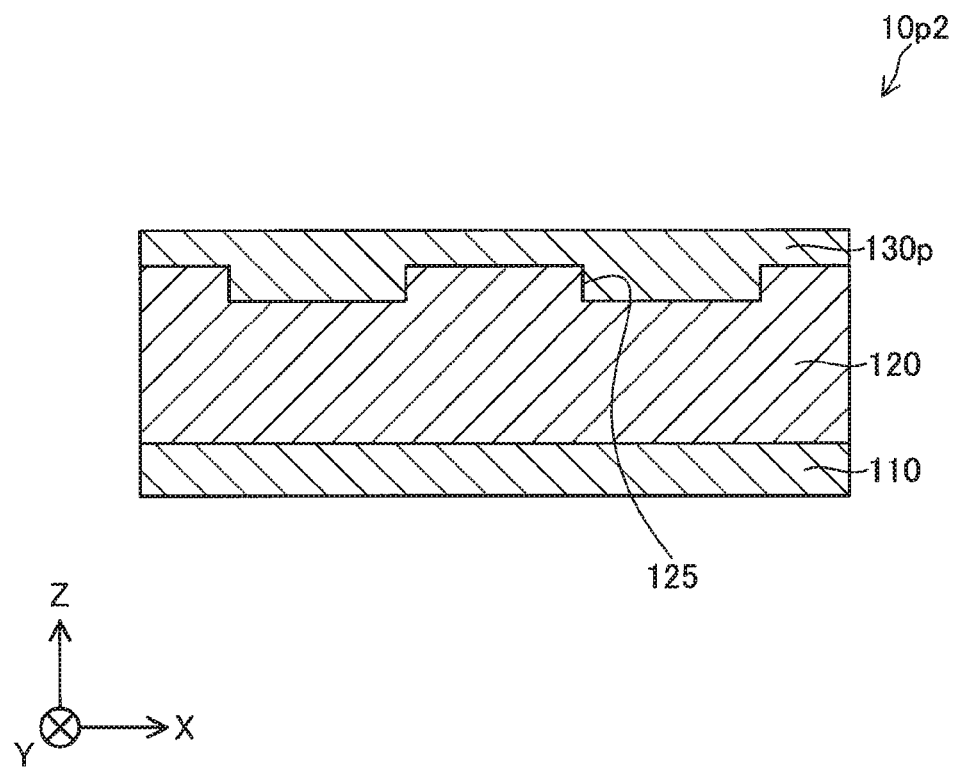

FIG. 4 is a sectional view schematically showing the configuration of a semiconductor device 10p2 being manufactured. FIG. 4 shows the configuration of the semiconductor device 10p2 after implementation of process P140. After the groove 125 is formed (process P130), the manufacturer performs a first mask removal process of removing the first masks 510 (process P135). Next, the manufacturer performs a p-type semiconductor layer formation process (process P140). In the p-type semiconductor layer formation process (process P140), a p-type semiconductor layer 130p is formed on the surface of the n-type semiconductor layer 120 including the groove 125. In the semiconductor device 10p2 shown in FIG. 4, the p-type semiconductor layer 130p is formed on the n-type semiconductor layer 120 after implementation of process P140.

Figure 5:
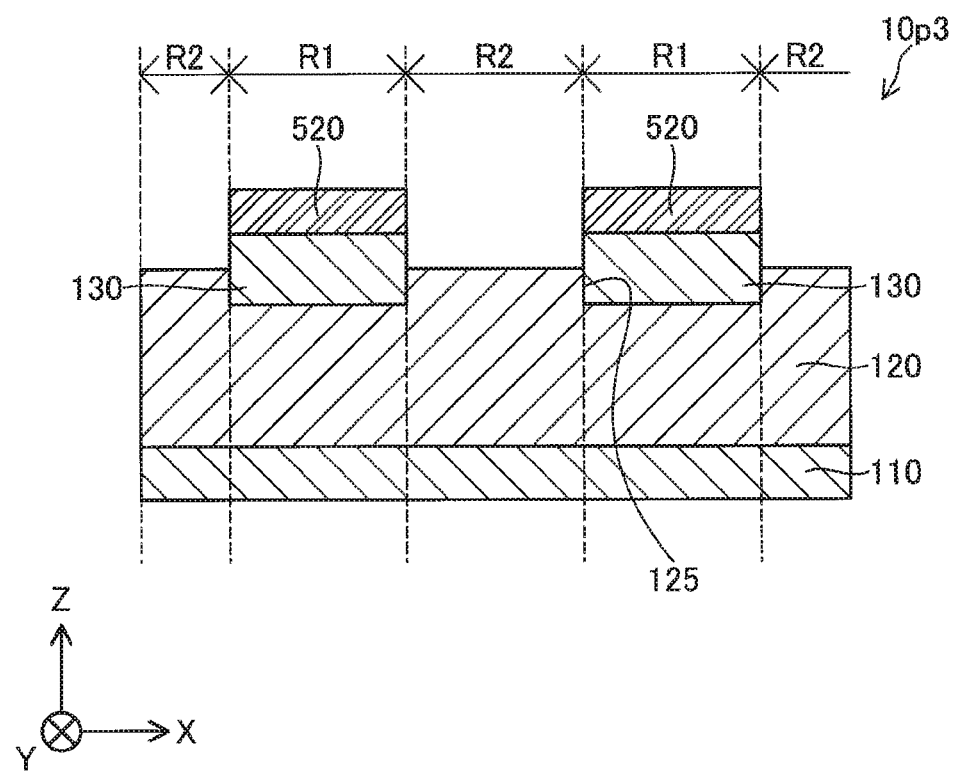

FIG. 5 is a sectional view schematically showing the configuration of a semiconductor device 10p3 being manufactured. FIG. 5 shows the configuration of the semiconductor device 10p3 after implementation of process P150. After the p-type semiconductor layer 130p is formed (process P140), the manufacturer performs an n-type semiconductor layer exposure process (process P150). In the n-type semiconductor layer exposure process (process P150), a second mask 520 is formed entirely on a surface of the p-type semiconductor layer 130p in a range R1 in the presence of the groove 125 as viewed in the Z-axis direction corresponding to a stacking direction. Then, a part of the p-type semiconductor layer 130p uncovered by the second mask 520 is dry etched so as to expose the n-type semiconductor layer 120 in a range R2 differing from the range R1. In other embodiments, the second mask 520 may be formed on a part of the p-type semiconductor layer 130p in the range R1, and then dry etching may be performed. In the semiconductor device 10p3 shown in FIG. 5, the n-type semiconductor layer 120 in the range R2 is exposed toward the +Z axis direction after implementation of process P150. Further, the p-type semiconductor layer 130 is formed on the groove 125. Like in the groove formation process (process P130), in the n-type semiconductor layer exposure process (process P150), wet etching may be performed using an alkaline solution such as tetramethyl ammonium hydroxide (TMAH) after the dry etching.

Figure 6:
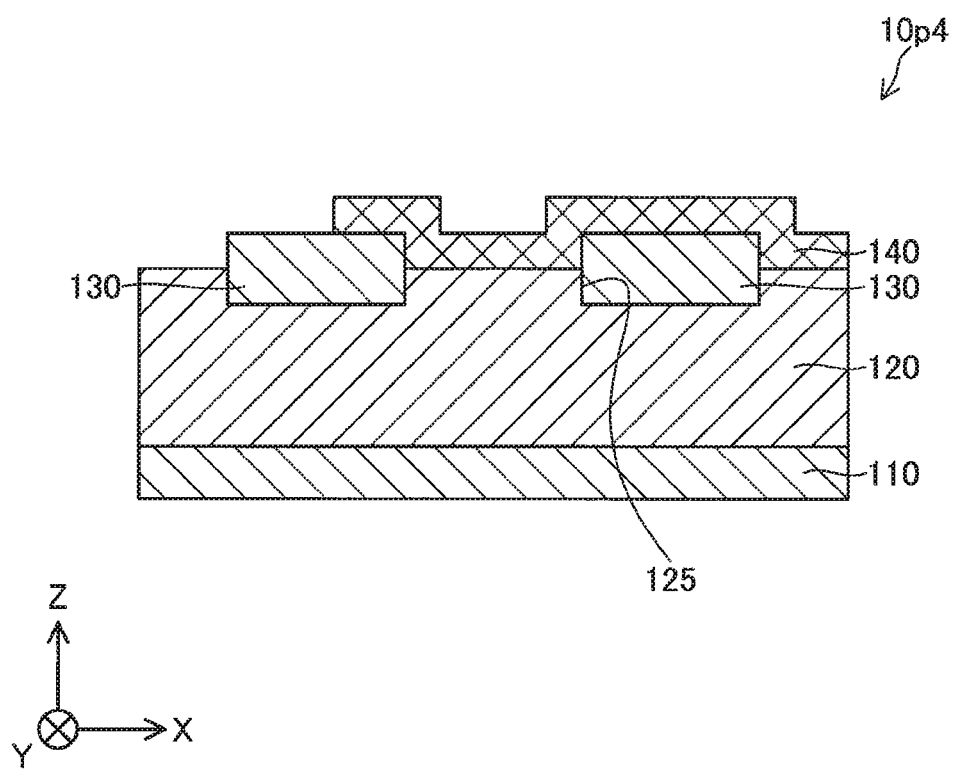

FIG. 6 is a sectional view schematically showing the configuration of a semiconductor device 10p4 being manufactured. FIG. 6 shows the configuration of the semiconductor device 10p4 after implementation of process P160. After the n-type semiconductor layer 120 is exposed (process P150), the manufacturer performs a second mask removal process of removing the second mask 520 (process P155). Next, the manufacturer performs a metal electrode formation process (process P160). In the metal electrode formation process (process P160), the metal electrode 140 contacting the exposed n-type semiconductor layer 120 and the p-type semiconductor layer 130 is formed. The metal electrode 140 is formed by lift-off technique using a resist mask. In other embodiments, the metal electrode 140 may be formed by forming a metal electrode on the entire surface of the semiconductor device toward the +Z axis direction after implementation of the second mask removal process (process P155), and then processing the resultant metal electrode by etching or ion milling. In the semiconductor device 10p4 shown in FIG. 6, after implementation of process P160, the metal electrode 140 is formed on the exposed n-type semiconductor layer 120 and the p-type semiconductor layer 130.

After the metal electrode 140 is formed (process P160), the manufacturer performs a wiring electrode formation process (process P170). In the wiring electrode formation process (process P170), the wiring electrode 150 is formed on the metal electrode 140 and a part of the p-type semiconductor layer 130. Next, the manufacturer performs a surface protective film formation process (process P180). In the surface protective film formation process (process P180), in a terminal part of the semiconductor device toward each of the +X axis direction and the −X axis direction during manufacture of the semiconductor device and at a time after implementation of process P170, the surface protective film 160 is formed on a part of the wiring electrode 150 and a part of the p-type semiconductor layer 130. Next, the manufacturer performs a back side electrode formation process (process P190). In the back side electrode formation process (process P190), the back side electrode 170 is formed on the substrate 110 toward the −Z axis direction. After implementation of the processes from process P110 to process P190 shown in FIG. 2, formation of the semiconductor device 10 in FIG. 1 is finished.

According to the foregoing manufacturing method of the first embodiment, even if etching proceeds more deeply than a position where the n-type semiconductor layer 120 in a part (range R2) differing from a part in the presence of the groove 125 (range R1) is exposed toward the +Z axis direction, it is still possible to reduce the likelihood of formation of a corner resulting from a recess in a part of the n-type semiconductor layer 120 at a deeper position than the p-type semiconductor layer 130. This allows reduction in the occurrence of electric field crowding resulting from formation of a corner. A corner will be described by referring to FIG. 7.

Figure 7:
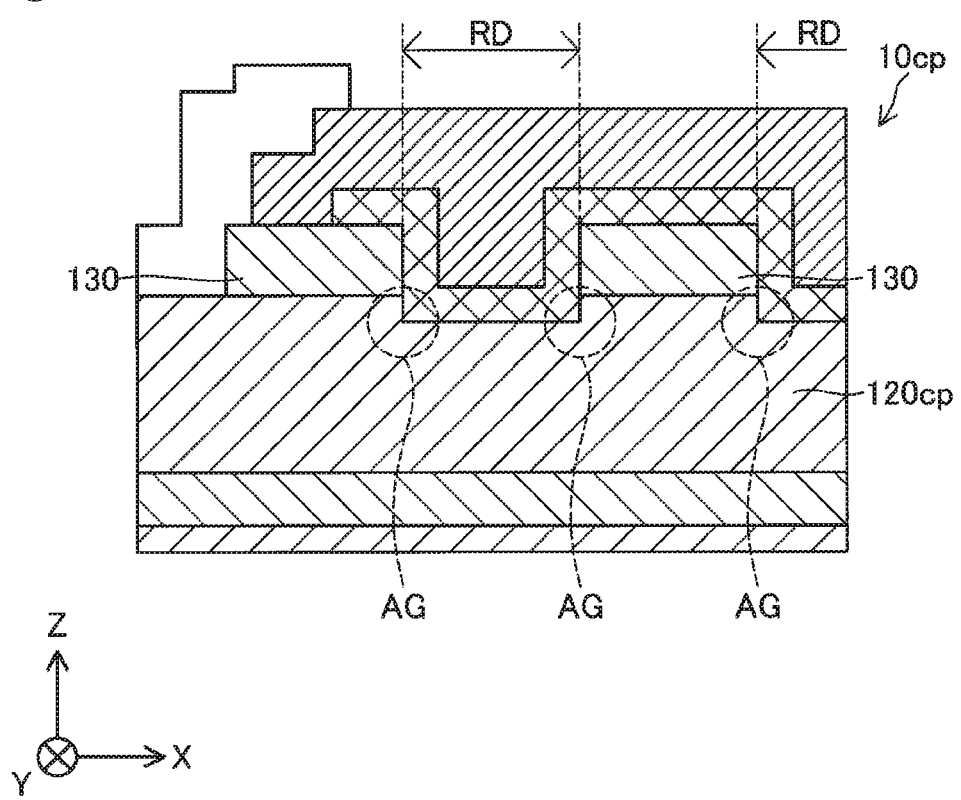
FIG. 7 is a sectional view showing the configuration of a semiconductor device of a comparative example.

FIG. 7 is a sectional view showing the configuration of a semiconductor device 10cp of a comparative example. FIG. 7 shows a terminal part of the semiconductor device 10cp of the comparative example toward the −X axis direction. To facilitate illustration, only an n-type semiconductor layer 120cp and the p-type semiconductor layer 130 of the semiconductor device 10cp shown in FIG. 7 are given signs. The n-type semiconductor layer 120cp in a range RD is recessed into a deep position in comparison to the p-type semiconductor layer 130. The deep position mentioned herein means a position toward the −Z axis direction. A corner AG is a corner formed by recessing a part of the n-type semiconductor layer 120cp into a deeper position than the p-type semiconductor layer 130. Electric field crowding is likely to occur at the corner AG to cause the risk of increase in reverse leakage current. By contrast, in the semiconductor device 10 manufactured by the manufacturing method of the first embodiment, it is possible to reduce the likelihood of formation of the corner AG. This allows reduction in the occurrence of electric field crowding resulting from formation of the corner AG.

B. Second Embodiment

B-1. Configuration of Semiconductor Device

Figure 8:
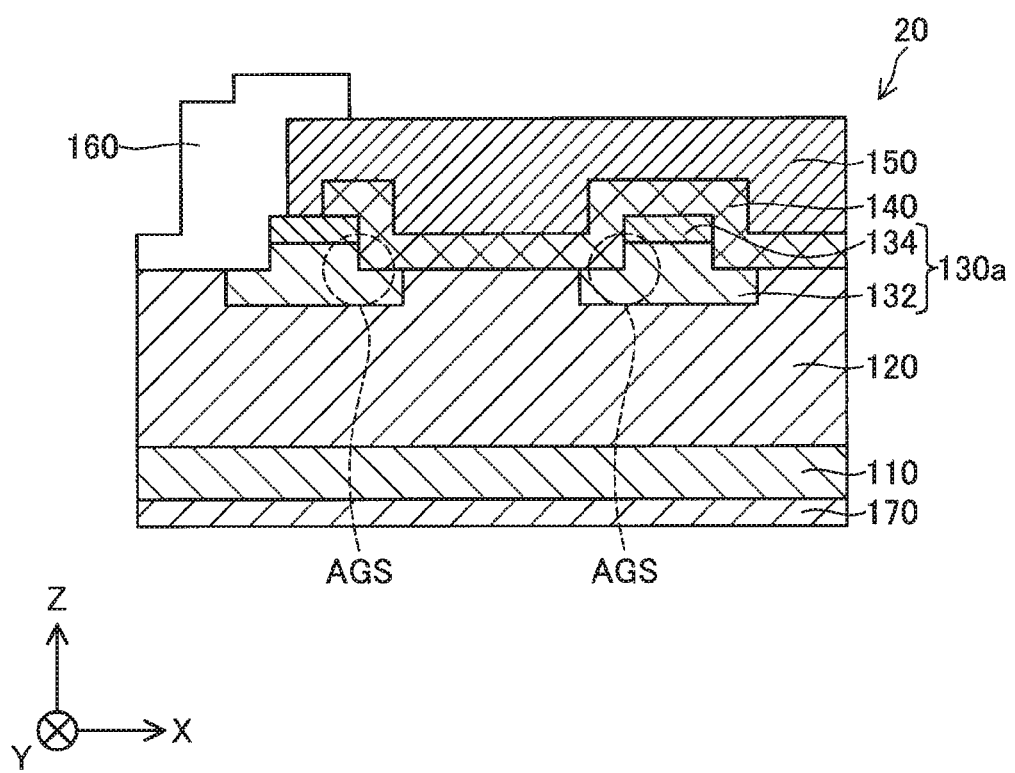
FIG. 8 is a sectional view showing a semiconductor device manufactured by a manufacturing method of a second embodiment.

FIG. 8 is a sectional view schematically showing the configuration of a semiconductor device 20 manufactured by a manufacturing method of a second embodiment. In comparison to the semiconductor device 10 manufactured by the manufacturing method of the first embodiment, the configuration of the semiconductor device 20 is the same as that of the semiconductor device 10 except that the semiconductor device 20 includes a p-type semiconductor layer 130a of a different configuration from the p-type semiconductor layer 130. Signs same as those of the semiconductor device 10 show corresponding structures and the description thereof already given above will be omitted.

Like the p-type semiconductor layer 130, the p-type semiconductor layer 130a is a semiconductor containing magnesium (Mg) as p-type impurities. The p-type semiconductor layer 130a includes a lower layer 132 and an upper layer 134. The concentration of magnesium (Mg) as p-type impurities in the upper layer 134 is higher than a magnesium (Mg) concentration in the lower layer 132.

B-2. Method of Manufacturing Semiconductor Device

Figure 9:
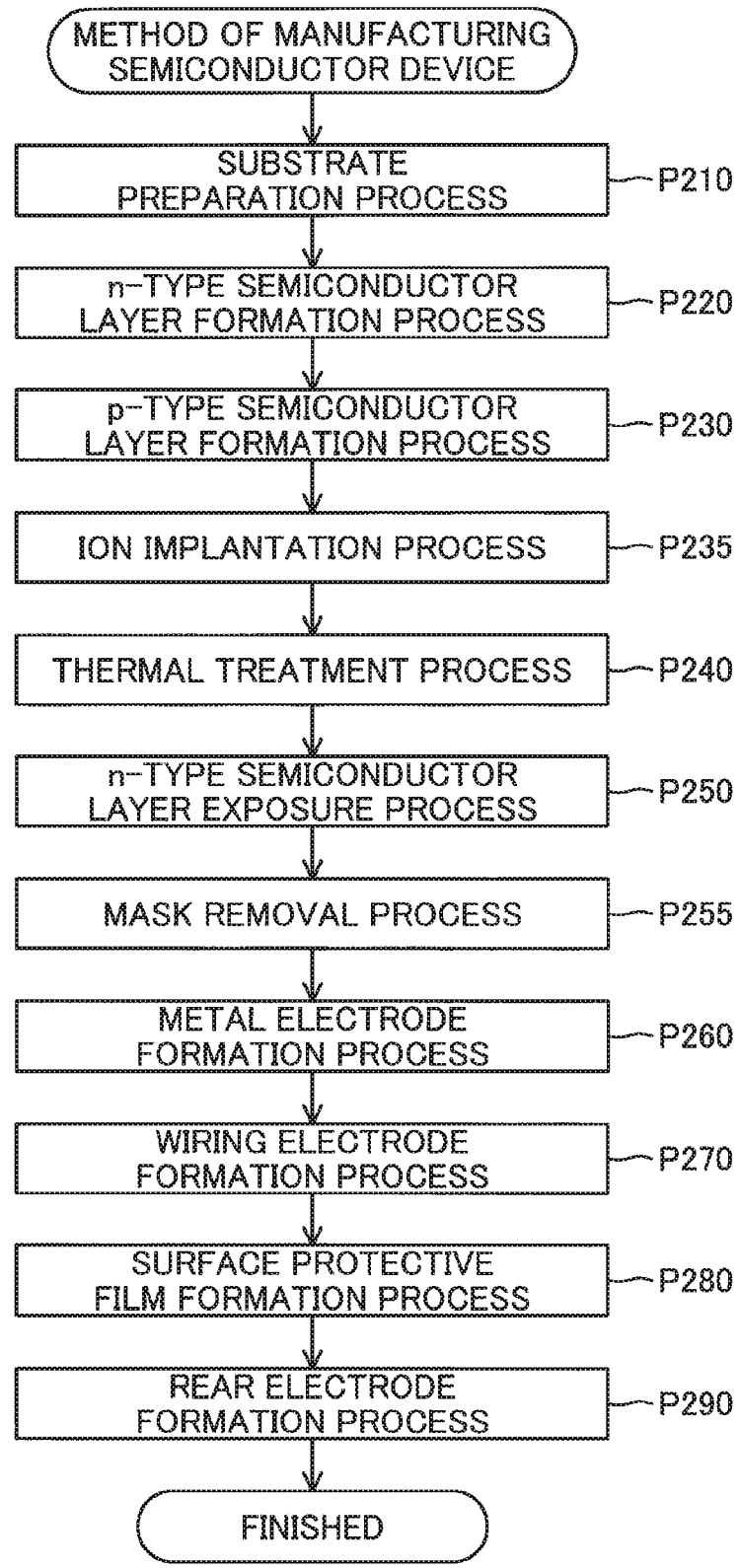
FIG. 9 is a process chart showing the manufacturing method of the second embodiment.
Figure 10:
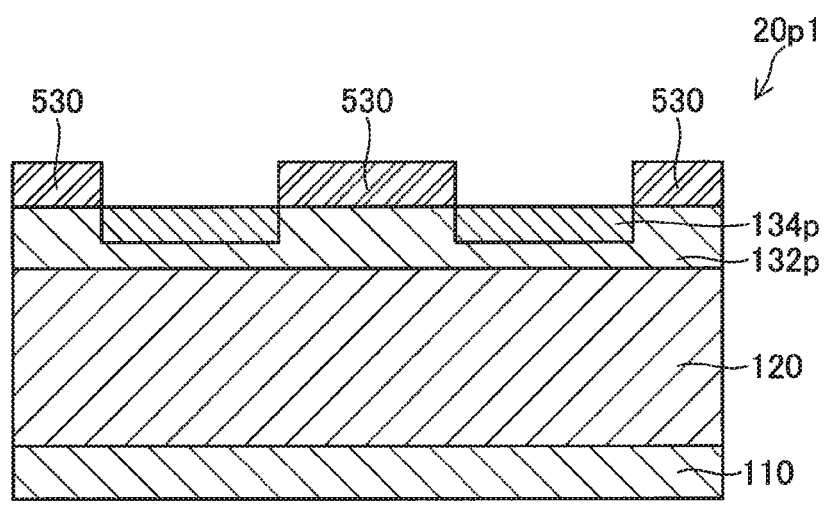

FIG. 9 is a process chart showing the method of manufacturing the semiconductor device 20. FIG. 10 is a sectional view schematically showing the configuration of a semiconductor device 20p1 being manufactured. FIG. 10 shows the configuration of the semiconductor device 20p 1 after implementation of process P210, process P220, process P230, and then process P235. A substrate preparation process (process P210) and an n-type semiconductor layer formation process (process P220) forming the manufacturing method of the second embodiment are the same as the substrate preparation process (process P110) and the n-type semiconductor layer formation process (process P120) forming the manufacturing method of the first embodiment.

After the n-type semiconductor layer 120 is formed (process P220), a manufacturer performs a p-type semiconductor layer formation process (process P230). In the p-type semiconductor layer formation process (process P230), a p-type semiconductor layer 132p is formed on the n-type semiconductor layer 120. After the p-type semiconductor layer 132p is formed (process P230), the manufacturer performs an ion implantation process (process P235). In the ion implantation process (process P235), p-type impurities are ion-implanted from above the p-type semiconductor layer 132p. The ion-implanted p-type impurities are magnesium (Mg). For implementation of process P235, the manufacturer forms a mask 530 on the p-type semiconductor layer 132p and then ion-implants the p-type impurities into the p-type semiconductor layer 132p. At this time, a film of aluminum oxide ($Al_2O_3$) or aluminum nitride (AlN) may be formed as a through film on the p-type semiconductor layer 132p and then the mask 530 may be formed on the through film. In the semiconductor device 20p1 shown in FIG. 10, after implementation of process P235, the p-type impurities are ion-implanted from a part of a surface of the p-type semiconductor layer 132p uncovered by the mask 530 to form an ion-implanted region 134p. After the ion implantation, the mask 530 is removed.

The ion implantation proceeds so as to form a peak of an implantation profile between a half-thickness position of the p-type semiconductor layer 132p in the Z-axis direction (a middle position in the Z-axis direction) to the surface of the p-type semiconductor layer 132p. Forming the peak at such a position allows the ion-implanted impurities to be prevented from reaching the n-type semiconductor layer 120. The position where the peak of the implantation profile of the ion implantation is formed is desirably from a one-third thickness position of the p-type semiconductor layer 132p in the Z-axis direction to the surface of the p-type semiconductor layer 132p, more desirably, from a one-fourth thickness position to the surface of the p-type semiconductor layer 132p.

In the second embodiment, implantation energy during the ion implantation is 250 keV. In other embodiments, implantation energy during the ion implantation is freely selectable from 10 to 500 keV. In the second embodiment, a temperature of the ion implantation is 300° C. In other embodiments, a temperature of the ion implantation is selectable from any value from 25 to 600° C. In the second embodiment, a dose of the ion implantation is $1.0 \times 10^{15}$ $cm^{-2}$. In other embodiments, a dose of the ion implantation is selectable from any value from $1.0 \times 10^{13}$ to $1.0 \times 10^{17}$ $cm^{-2}$.

FIG. 11 is a sectional view schematically showing the configuration of a semiconductor device 20p2 being manufactured. FIG. 11 shows the configuration of the semiconductor device 20p2 after implementation of process P240. After the ions are implanted (process P235), the manufacturer performs thermal treatment process (process P240). In the thermal treatment process (process P240), the thermal treatment is performed to activate the p-type impurities in the ion-implanted region 134p. Further, the p-type impurities in the p-type semiconductor layer 132p are diffused into the n-type semiconductor layer 120 closer to the −Z axis direction than the ion-implanted region 134p, thereby forming a p-type impurity diffusion region 132s. A temperature of the thermal treatment is 1100° C. In other embodiments, a temperature of the thermal treatment is selectable from any value from 900 to 1300° C. Time of the thermal treatment is 60 minutes. In other embodiments, time of the thermal treatment is selectable from any value from 0.5 to 120 minutes. The semiconductor device 20p2 shown in FIG. 11 includes the p-type impurity diffusion region 132s formed closer to the −Z axis direction than the ion-implanted region 134p after implementation of process P240.

Figure 12:
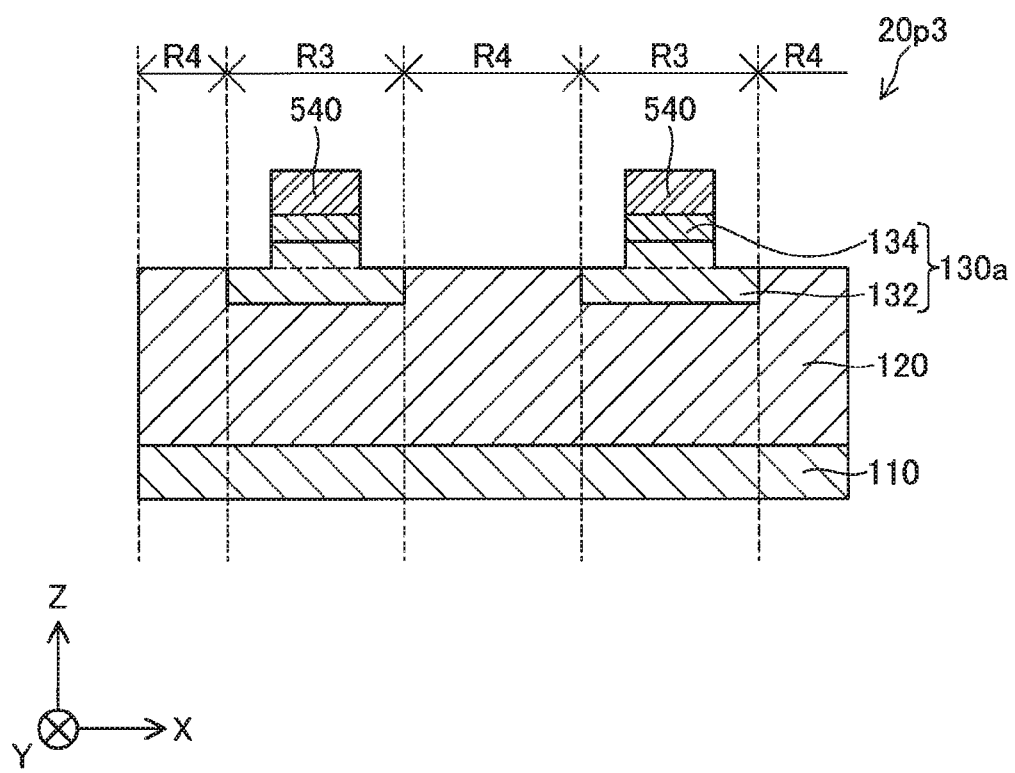

FIG. 12 is a sectional view schematically showing the configuration of a semiconductor device 20p3 being manufactured. FIG. 12 shows the configuration of the semiconductor device 20p3 after implementation of process P250. After the thermal treatment is performed (process P240), the manufacturer performs an n-type semiconductor layer exposure process (process P250). In the n-type semiconductor layer exposure process (process P250), a mask 540 is formed on a part of the ion-implanted region 134p in an ion-implanted range R3. Then, a part of the ion-implanted region 134p, a part the p-type semiconductor layer 132p, and a part of the p-type impurity diffusion region 132s formed in a partial area of the n-type semiconductor layer 120 uncovered by the mask 540 are dry etched so as to expose the n-type semiconductor layer 120 in a range R4 differing from the range R3 in the presence of the p-type impurity diffusion region 132s. In the semiconductor device 20p3 shown in FIG. 12, the n-type semiconductor layer 120 in the range R4 is exposed toward the +Z axis direction after implementation of process P250. Further, the lower layer 132 and the upper layer 134 shown in FIG. 8 are formed in the semiconductor device 20p3 after implementation of process P250. Like in the n-type semiconductor layer exposure process (process P150) of the first embodiment, in the n-type semiconductor layer exposure process (process P250), wet etching may be performed using an alkaline solution such as tetramethyl ammonium hydroxide (TMAH) after the dry etching.

After the n-type semiconductor layer 120 is exposed (process P250), the manufacturer performs a mask removal process of removing the mask 540 (process P255). Processes after the mask removal process (process P255) from a metal electrode formation process (process P260) to a back side electrode formation process (process P290) are the same as the processes from the metal electrode formation process (process P160) to the back side electrode formation process (process P190) according to the manufacturing method of the first embodiment shown in FIG. 2. After implementation of the processes from process P210 to process P290 shown in FIG. 9, formation of the semiconductor device 20 in FIG. 8 is finished.

According to the foregoing manufacturing method of the second embodiment, even if etching proceeds more deeply than a position where the n-type semiconductor layer 120 in the range R4 differing from the range R3 in the presence of the lower layer 132 is exposed, it is still possible to reduce the likelihood of formation of a corner resulting from a recess in a part of the n-type semiconductor layer 120 at a deeper position than the p-type semiconductor layer 130a. This allows reduction in the occurrence of electric field crowding resulting from formation of a corner. In the semiconductor device 20 manufactured by the manufacturing method of the second embodiment, in comparison to a semiconductor device in which the entire p-type semiconductor layer 130a is composed only of the lower layer 132, contact resistance is reduced at an interface between the metal electrode 140 and the upper layer 134. This makes it possible to flow a current easily in a pn region in response to application of a voltage in a forward direction (−Z axis direction). In the semiconductor device 20 manufactured by the manufacturing method of the second embodiment, the p-type semiconductor layer 130a extends further toward the −Z axis direction than a corner AGS at the metal electrode 140 (FIG. 8). This allows reduction in the occurrence of electric field crowding around the corner AGS.

C. Third Embodiment

C-1. Configuration of Semiconductor Device

A semiconductor device manufactured by a manufacturing method of a third embodiment has the same configuration as the semiconductor device 10 manufactured by the manufacturing method of the first embodiment.

C-2. Method of Manufacturing Semiconductor Device

Figure 13:
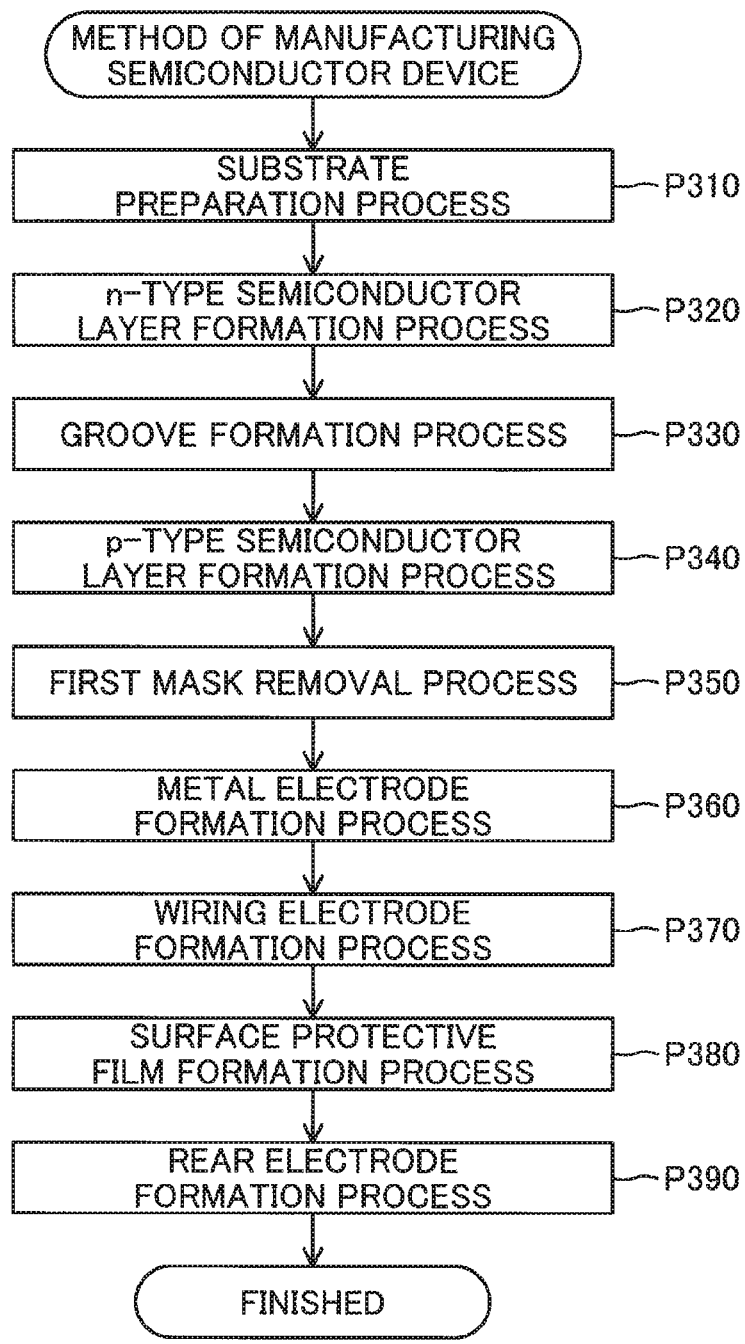
FIG. 13 is a process chart showing a manufacturing method of a third embodiment.
Figure 14:
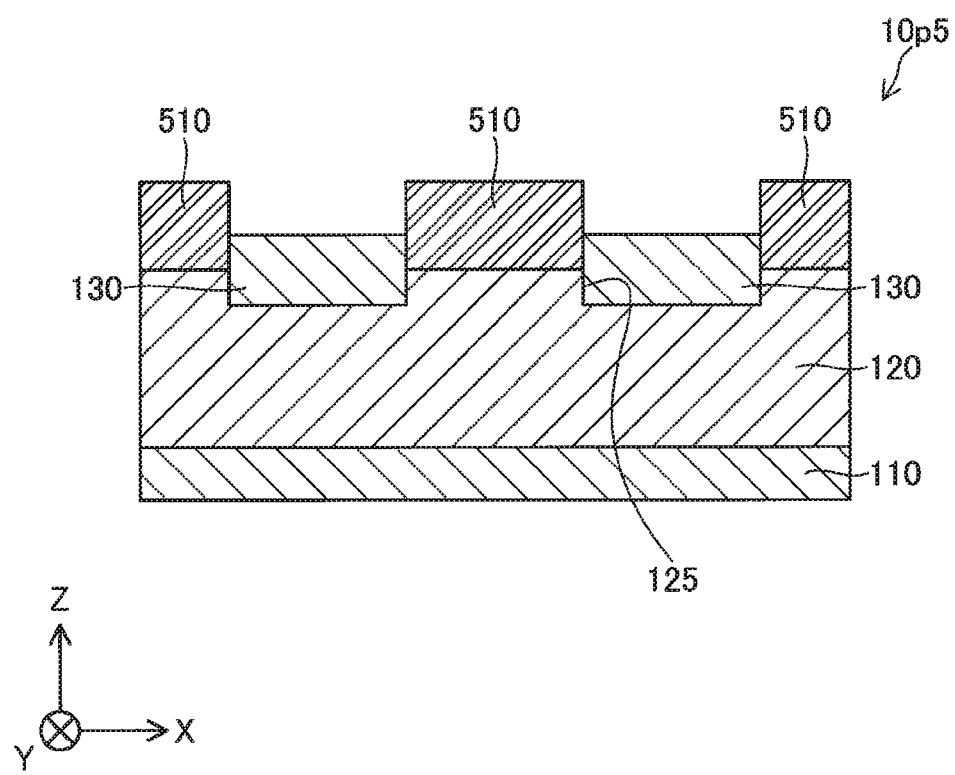
FIG. 14 is a sectional view showing the configuration of a semiconductor device being manufactured.

FIG. 13 is a process chart showing the method of manufacturing the semiconductor device of the third embodiment. FIG. 14 is a sectional view schematically showing the configuration of the semiconductor device 10p5 being manufactured. FIG. 14 shows the configuration of a semiconductor device 10p5 after implementation of process P310, process P320, process P330, and then process P340. A substrate preparation process (process P310), an n-type semiconductor layer formation process (process P320), and a groove formation process (process P330) forming the manufacturing method of the third embodiment are the same as the substrate preparation process (process P110), the n-type semiconductor layer formation process (process P120), and the groove formation process (process P130) forming the manufacturing method of the first embodiment.

According to the manufacturing method of the first embodiment shown in FIG. 2, after implementation of the groove formation process (process P130), the first mask removal process (process P135) and the p-type semiconductor layer formation process (process P140) are performed in this order. According to the manufacturing method of the third embodiment, after implementation of the groove formation process (process P330), the p-type semiconductor layer formation process is performed (process P340) without removing the first mask 510. In the p-type semiconductor layer formation process (process P340), the p-type semiconductor layer 130 is formed to extend from the groove 125 to a position closer to the +Z axis direction than an interface between the first mask 510 and the n-type semiconductor layer 120. In other words, the p-type semiconductor layer 130 is formed to extend to the position closer to the +Z axis direction than the interface between the first mask 510 and the n-type semiconductor layer 120 while filling the groove 125. The semiconductor device 10p5 shown in FIG. 14 includes the p-type semiconductor layer 130 formed after implementation of process P340.

After the p-type semiconductor layer 130 is formed (process P340), a manufacturer performs a first mask removal process of removing the first mask 510 (process P350). Processes after the first mask removal process (process P350) from a metal electrode formation process (process P360) to a back side electrode formation process (process P390) are the same as the processes from the metal electrode formation process (process P160) to the back side electrode formation process (process P190) according to the manufacturing method of the first embodiment shown in FIG. 2. After implementation of the processes from process P310 to process P390 shown in FIG. 13, formation of the semiconductor device 10 in FIG. 1 is finished.

The foregoing manufacturing method of the third embodiment makes it possible to reduce the likelihood of formation of a corner resulting from a recess in a part of the n-type semiconductor layer 120 at a deeper position than the p-type semiconductor layer 130. This allows reduction in the occurrence of electric field crowding resulting from formation of a corner.

D. Fourth Embodiment

D-1. Configuration of Semiconductor Device

Figure 15:
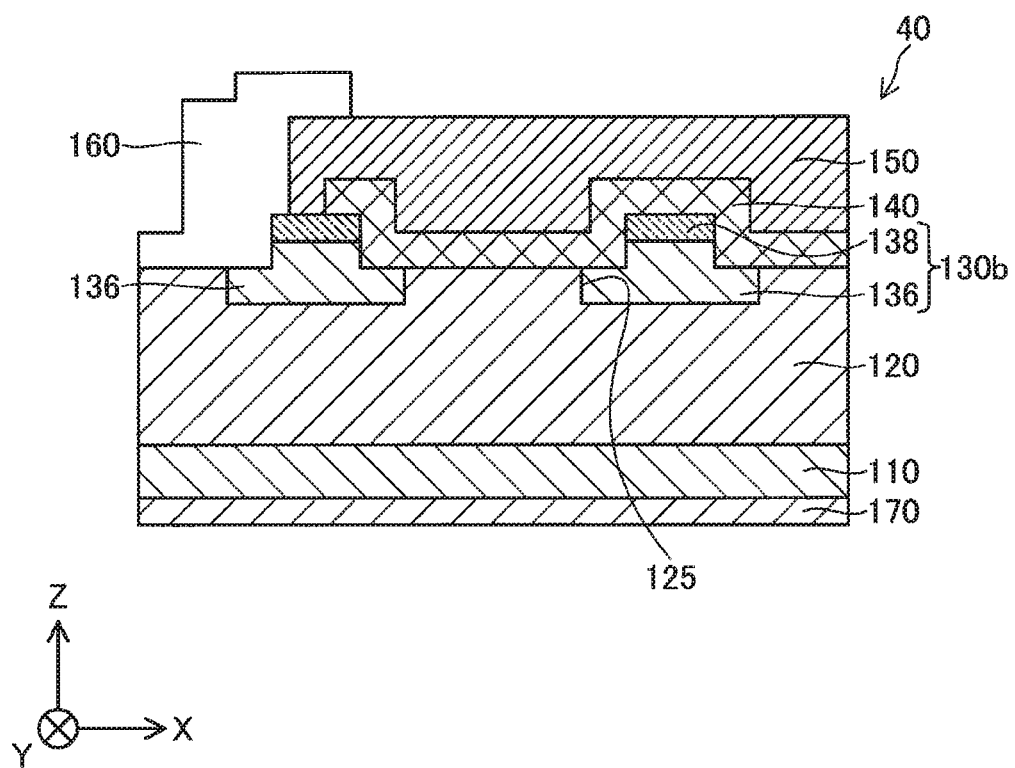
FIG. 15 is a sectional view showing a semiconductor device manufactured by a manufacturing method of a fourth embodiment.

FIG. 15 is a sectional view schematically showing the configuration of a semiconductor device 40 manufactured by a manufacturing method of a fourth embodiment. In comparison to the semiconductor device 10 (FIG. 1) manufactured by the manufacturing method of the first embodiment, the configuration of the semiconductor device 40 is the same as that of the semiconductor device 10 except that the semiconductor device 40 includes a p-type semiconductor layer 130b of a different configuration from the p-type semiconductor layer 130. Signs same as those of the semiconductor device 10 show corresponding structures and the description thereof already given above will be omitted.

D-2. Method of Manufacturing Semiconductor Device

The manufacturing method of the fourth embodiment is the same as the manufacturing method of the first embodiment shown in FIG. 2 except that the substance of process P140 and the substance of process P150 differ between the manufacturing methods. For reason of schematic illustrations in the drawings, the p-type semiconductor layer 130b is illustrated as having a similar shape to the p-type semiconductor layer 130a in the semiconductor device 20 (FIG. 8) manufactured by the manufacturing method of the second embodiment. However, there is a difference between the process of forming the p-type semiconductor layer 130a and a process of forming the p-type semiconductor layer 130b.

The p-type semiconductor layer 130b includes a lower layer 136 and an upper layer 138. The concentration of magnesium (Mg) as p-type impurities in the upper layer 138 is higher than a magnesium (Mg) concentration in the lower layer 136.

Figure 16:
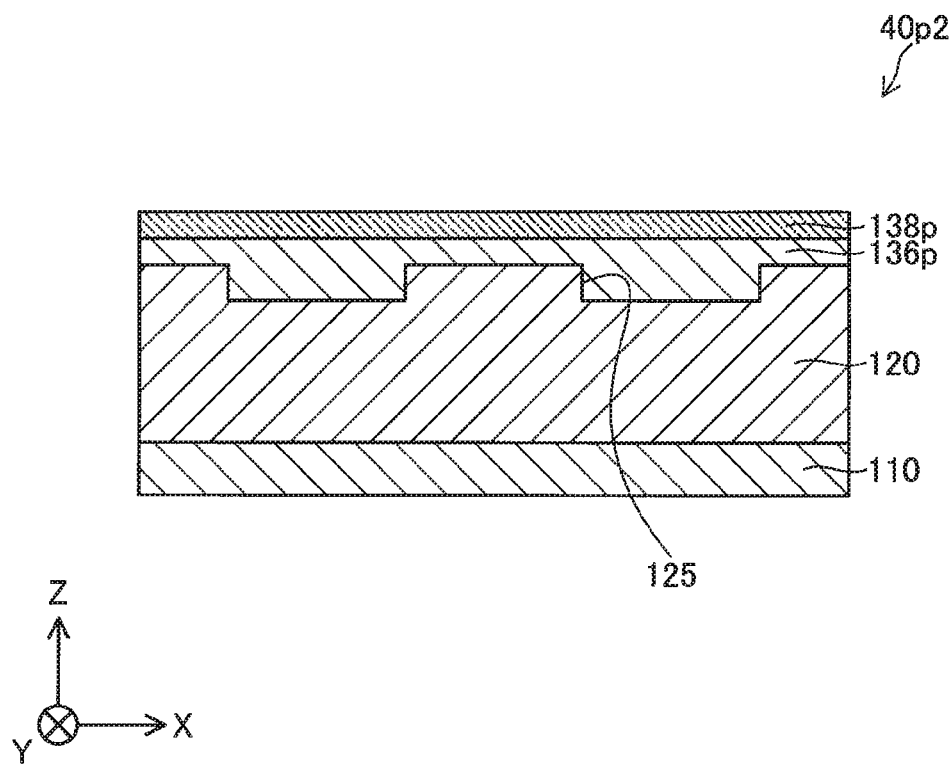
FIGS. 16 and 17 are sectional views each showing the configuration of the semiconductor device being manufactured.

FIG. 16 is a sectional view schematically showing the configuration of a semiconductor device 40p2 being manufactured. FIG. 16 shows the configuration of the semiconductor device 40p2 after implementation of process P140 of the fourth embodiment. In the p-type semiconductor layer formation process (process P140) of the fourth embodiment, a p-type semiconductor layer 136p is formed on the n-type semiconductor layer 120 including the groove 125, and a p-type semiconductor layer 138p is formed on a surface of the p-type semiconductor layer 136p. The concentration of magnesium (Mg) as p-type impurities in the p-type semiconductor layer 138p is higher than a magnesium (Mg) concentration in the p-type semiconductor layer 136p.

Figure 17:
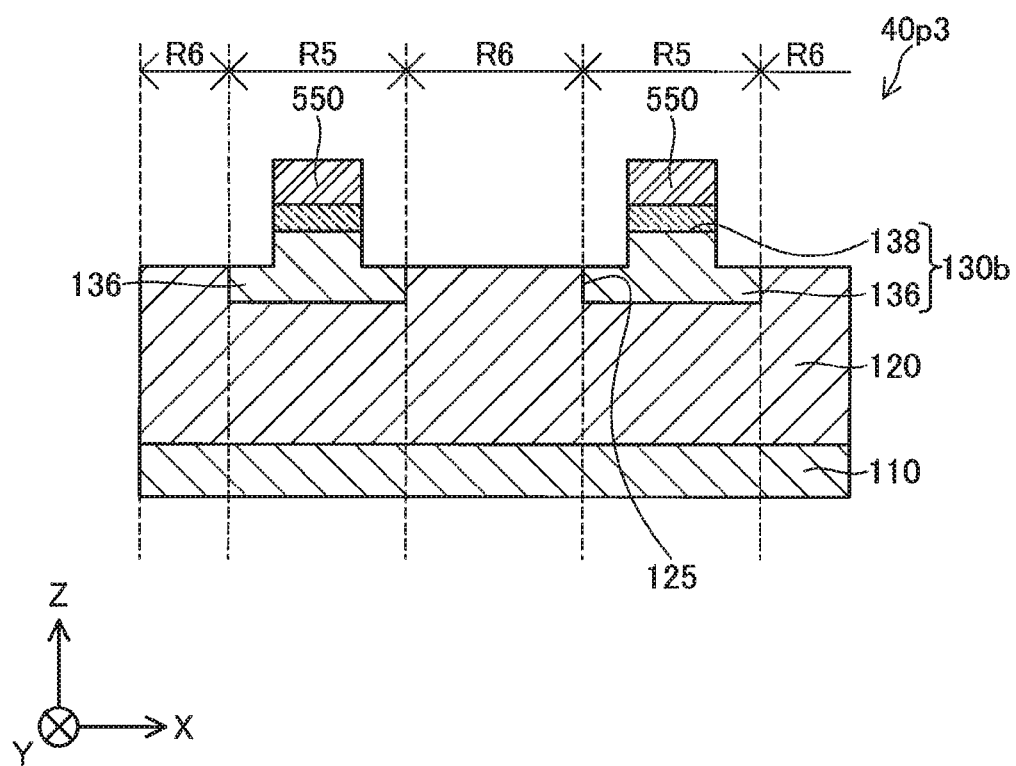

FIG. 17 is a sectional view schematically showing the configuration of a semiconductor device 40p3 being manufactured. FIG. 17 shows the configuration of the semiconductor device 40p3 after implementation of process P150 of the fourth embodiment. In the n-type semiconductor layer formation process (process P150) of the fourth embodiment, a second mask 550 is formed on a part of a surface of the p-type semiconductor layer 138p in a range R5 in the presence of the groove 125 as viewed in the Z-axis direction corresponding to a stacking direction. Then, a part of the p-type semiconductor layer 136p, a part of the p-type semiconductor layer 138p, and a part of the n-type semiconductor layer 120 uncovered by the second mask 550 are dry etched so as to expose the n-type semiconductor layer 120 in a range R6 differing from the range R5. In the semiconductor device 40p3 shown in FIG. 17, the n-type semiconductor layer 120 in the range R6 is exposed toward the +Z axis direction after implementation of process P150 of the fourth embodiment. Further, the p-type semiconductor layer 130b is formed on the groove 125. After implementation of the processes from process P110 to process P130 shown in FIG. 2, process P140 and process P150 of the fourth embodiment described above, and the processes from process P155 to process P190 shown in FIG. 2, formation of the semiconductor device 40 in FIG. 15 is finished.

According to the foregoing manufacturing method of the fourth embodiment, even if etching proceeds more deeply than a position where the n-type semiconductor layer 120 in a part (range R6) differing from a part in the presence of the groove 125 (range R5) is exposed, it is still possible to reduce the likelihood of formation of a corner resulting from a recess in a part of the n-type semiconductor layer 120 at a deeper position than the p-type semiconductor layer 130b. This allows reduction in the occurrence of electric field crowding resulting from formation of a corner. In the semiconductor device 40 manufactured by the manufacturing method of the fourth embodiment, in comparison to a semiconductor device in which the entire p-type semiconductor layer 130b is composed only of the lower layer 136, contact resistance is reduced at an interface between the metal electrode 140 and the upper layer 138. This makes it possible to flow a current easily in a pn region in response to application of a voltage in a forward direction (−Z axis direction). In the semiconductor device 40 manufactured by the manufacturing method of the fourth embodiment, the p-type semiconductor layer 130b extends further toward the −Z axis direction than a corner at the metal electrode 140. This allows reduction in the occurrence of electric field crowding around the corner.

E. Fifth Embodiment

E-1. Configuration of Semiconductor Device

Figure 18:
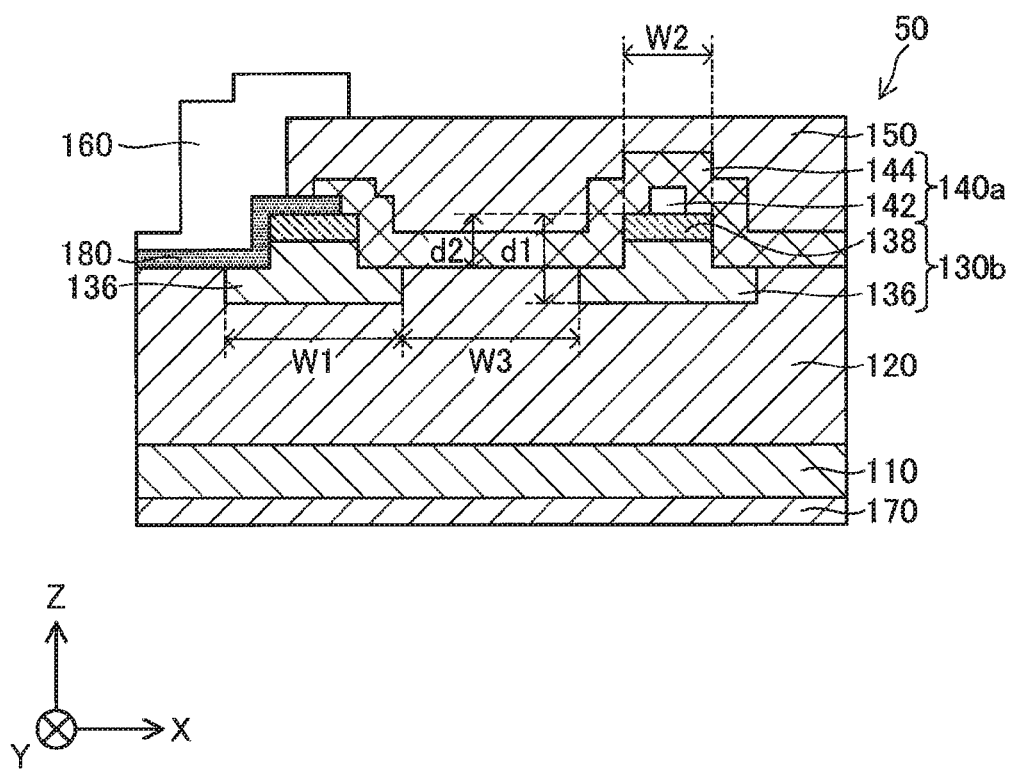
FIG. 18 is a sectional view showing a semiconductor device manufactured by a manufacturing method of a fifth embodiment.

FIG. 18 is a sectional view schematically showing the configuration of a semiconductor device 50 manufactured by a manufacturing method of a fifth embodiment. In comparison to the semiconductor device 40 shown in FIG. 15, the configuration of the semiconductor device 50 is the same as that of the semiconductor device 40 except that the semiconductor device 50 includes a metal electrode 140a of a different configuration from the metal electrode 140, and an insulating film 180. Signs same as those of the semiconductor device 40 show corresponding structures and the description thereof already given above will be omitted.

E-2. Method of Manufacturing Semiconductor Device

In comparison to the manufacturing method of the fourth embodiment, the manufacturing method of the fifth embodiment is the same as the manufacturing method of the fourth embodiment except that the substance of process P160 differs between the manufacturing methods and a process of forming the insulating film 180 is added.

The metal electrode 140a is arranged on the n-type semiconductor layer 120 and the p-type semiconductor layer 130b. In a terminal part of the semiconductor device 50 toward each of the +X axis direction and the −X axis direction, the metal electrode 140a is arranged on a part of the p-type semiconductor layer 130b and a part of the insulating film 180. The metal electrode 140a includes a first layer 142 and a second layer 144.

The first layer 142 of the metal electrode 140a is arranged at a position contacting the upper layer 138. The first layer 142 has a work function higher than the electron affinity of the upper layer 138 contacting the first layer 142. The work function of the first layer 142 is preferably higher than the electron affinity of the upper layer 138. Such a value as the work function of the first layer 142 allows reduction in resistance at an interface between the first layer 142 and the upper layer 138, thereby facilitating flow of a current in this interface.

A part of the second layer 144 of the metal electrode 140a is formed at a position contacting the n-type semiconductor layer 120. The second layer 144 has a work function higher than the electron affinity of the n-type semiconductor layer 120. The second layer 144 has the work function lower than the work function of the first layer 142 preferably. The work function of the second layer 144 is preferably higher than the electron affinity of the n-type semiconductor layer 120. Such a value as the work function of the second layer 144 allows reduction in ON voltage at a Schottky junction to achieve reduction in time until a forward current (a current to flow toward the −Z axis direction) starts to flow. Each of the work function of the first layer 142 and the work function of the second layer 144 is higher than the electron affinity of the n-type semiconductor layer 120 by 0.5 eV or more.

Regarding the metal electrode 140 of the semiconductor device 10 (FIG. 1) manufactured by the manufacturing method of the first embodiment, while a current flows easily in the pn region PN in response to application of a voltage in a forward direction (−Z axis direction), a current does not flow easily in the Schottky region SR. By contrast, regarding the metal electrode 140a of the semiconductor device 50 manufactured by the manufacturing method of the fifth embodiment, the work function of the first layer 142 is increased in a pn region and the work function of the second layer 144 is reduced in a Schottky region (both the work function of the first layer 142 and the work function of the second layer 144 are higher than the electron affinity of the n-type semiconductor layer 120). By doing so, a current is allowed to flow easily in each of the pn region and the Schottky region. Further, providing a metal electrode with multiple stacked layers such as the metal electrode 140a makes it possible to extend a range of design of a semiconductor device.

In the metal electrode formation process (process P160) of the fifth embodiment, the metal electrode 140a with the first layer 142 and the second layer 144 is formed on the exposed n-type semiconductor layer 120 and the p-type semiconductor layer 130b. The first layer 142 and the second layer 144 of the metal electrode 140a are formed in this order. Thermal treatment may be performed after formation of the first layer 142 and before formation of the second layer 144. Performing thermal treatment allows reduction in contact resistance at the interface between the first layer 142 and the upper layer 138. A temperature of the thermal treatment is selected from any value from 400 to 700° C. Time of the thermal treatment is selected from any value from 30 seconds to 120 minutes. In the semiconductor device 10 (FIG. 1) manufactured by the manufacturing method of the first embodiment, performing thermal treatment after formation of the metal electrode 140 facilitates flow of a forward current in the pn region PN, while unintentionally increasing reverse leakage in the Schottky region SR. By contrast, regarding the metal electrode 140a of the semiconductor device 50 manufactured by the manufacturing method of the fifth embodiment, implementation of the thermal treatment is allowed after formation of the first layer 142 and before formation of the second layer 144. This makes it possible to facilitate flow of a forward current in the pn region without causing increase in reverse leakage in the Schottky region.

In the terminal part of the semiconductor device 50 toward each of the +X axis direction and the −X axis direction, the insulating film 180 is arranged at a position caught between the upper layer 138 and the second layer 144. According to the manufacturing method of the fifth embodiment, a process of forming the insulating film is preformed between the second mask removal process (process P155) and the metal electrode formation process (process P160).

Under constraints of electrical characteristics or processes in terms of alleviating electric field crowding and facilitating flow of a forward current, the dimensions of the semiconductor device 50 are preferably determined as follows. Regarding a distance W1 and a distance W2, the distance W1 is preferably larger than the distance W2, and both the distances W1 and W2 are preferably selected from any value of 1 μm or more and 10 μm or less. A distance W3 is also preferably selected from any value of 1 μm or more and 10 μm or less. Regarding a distance d1 and a distance d2, the distance d1 is preferably larger than the distance d2. The distance d1 is preferably selected from any value of 0.5 μm or more and 10 μm or less. The distance d2 is preferably selected from any value of 0.1 μm or more and to 5 μm or less. In other embodiments, the semiconductor device 50 may be configured in such a manner that the upper layer 138 and the first layer 142 are omitted according to a purpose, and the corresponding parts are filled with the lower layer 136 and the second layer 144.

In the semiconductor device 50 manufactured by the foregoing manufacturing method of the fifth embodiment, it is also possible to reduce the likelihood of formation of a corner resulting from a recess in a part of the n-type semiconductor layer 120 at a deeper position than the p-type semiconductor layer 130b. This allows reduction in the occurrence of electric field crowding resulting from formation of a corner. Further, formation of the insulating film 180 makes it possible to reduce the occurrence of electric field crowding further in the terminal part of the semiconductor device 50 toward each of the +X axis direction and the −X axis direction. The metal electrode 140a with the first layer 142 and the second layer 144 and the insulating film 180 provided in the semiconductor device 50 manufactured by the manufacturing method of the fifth embodiment may be provided in the other semiconductor devices manufactured by the manufacturing methods of the other embodiments described in this specification.

F. Sixth Embodiment

F-1. Configuration of Semiconductor Device

Figure 19:
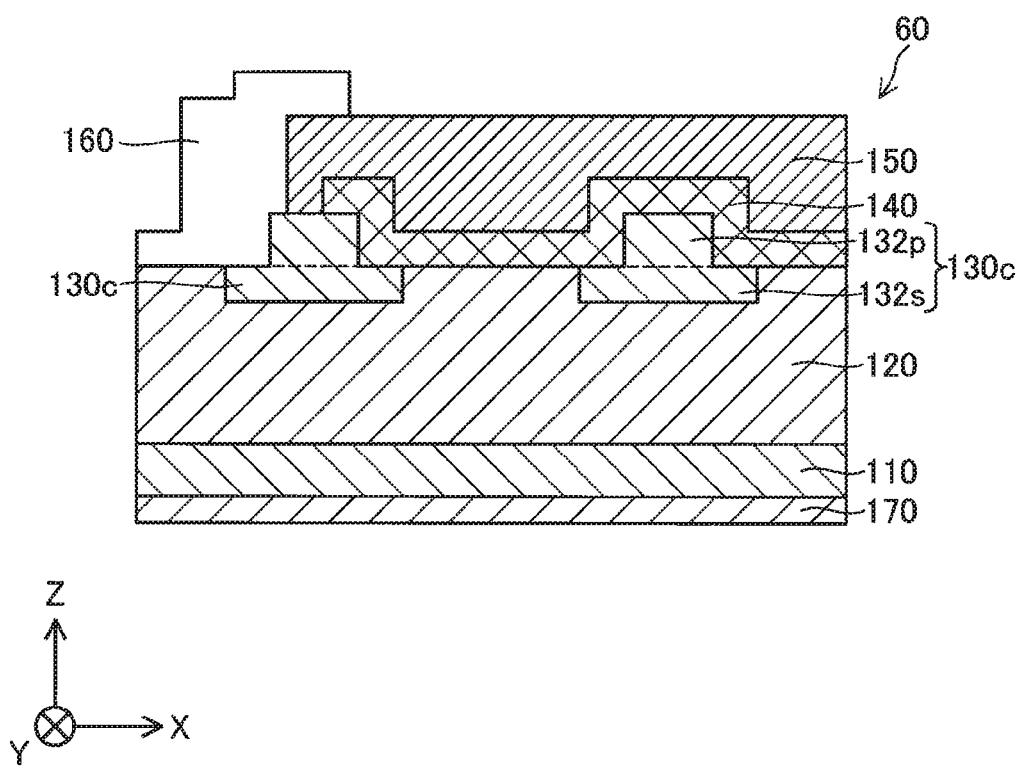
FIG. 19 is a sectional view showing a semiconductor device manufactured by a manufacturing method of a sixth embodiment.

FIG. 19 is a sectional view schematically showing the configuration of a semiconductor device 60 manufactured by a manufacturing method of a sixth embodiment. In comparison to the semiconductor device 20 (FIG. 8) manufactured by the manufacturing method of the second embodiment, the configuration of the semiconductor device 60 is the same as that of the semiconductor device 20 except that the semiconductor device 60 includes a p-type semiconductor layer 130c of a different configuration from the p-type semiconductor layer 130a. Signs same as those of the semiconductor device 20 show corresponding structures and the description thereof already given above will be omitted.

F-2. Method of Manufacturing Semiconductor Device

Figure 20:
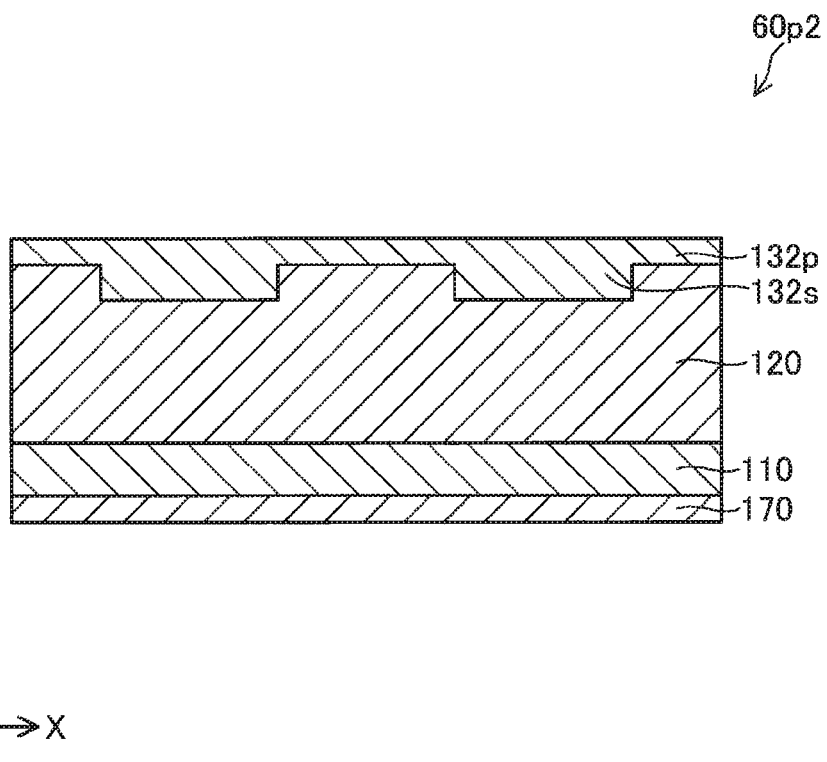
FIG. 20 is a sectional view showing the configuration of the semiconductor device being manufactured.
Figure 29:
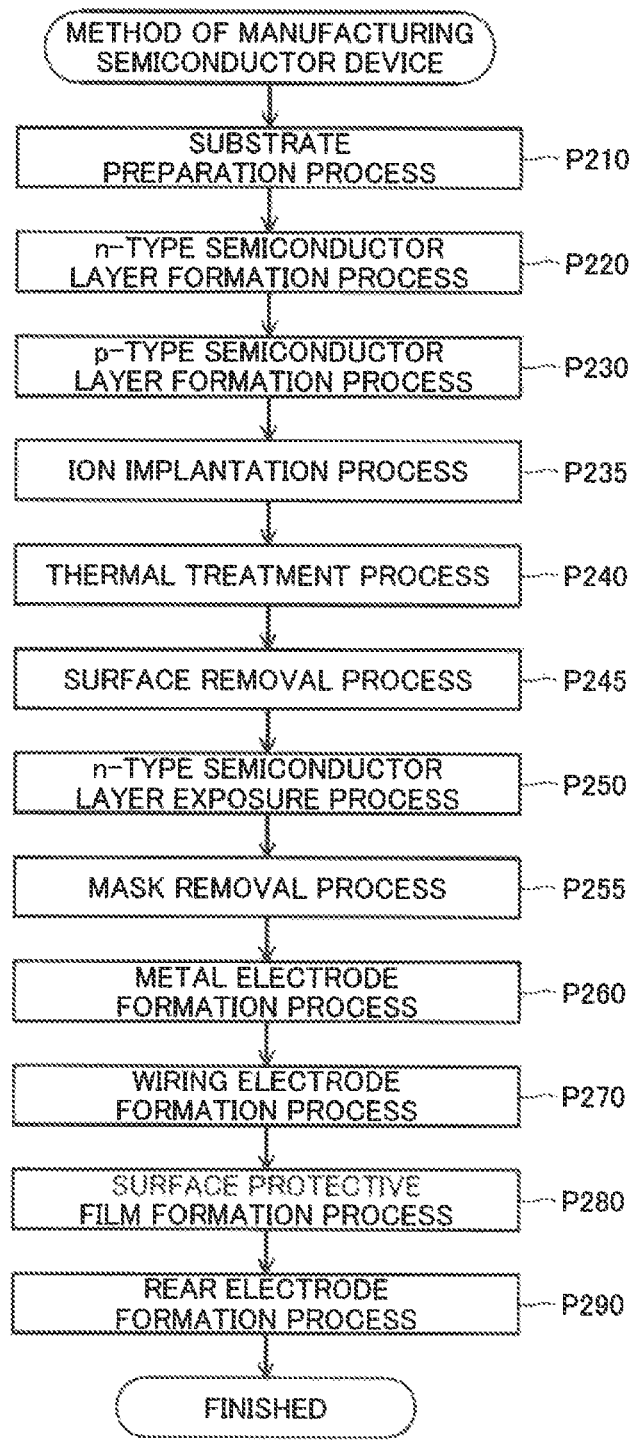
FIG. 29 is a process chart showing the manufacturing method of the sixth embodiment.

FIG. 20 is a sectional view schematically showing the configuration of a semiconductor device 60p2 being manufactured. FIG. 20 shows the configuration of the semiconductor device 60p2 after implementation of process P240 of the sixth embodiment and then the surface removal process P245, as shown in FIG. 29. In the surface removal process P245 of the sixth embodiment, in the semiconductor device being manufactured after implementation of process P240 (semiconductor device 20p2 shown in FIG. 11), the p-type semiconductor layer 132p including a part in the presence of the ion-implanted region 134p is etched in the Z-axis direction corresponding to a stacking direction from a surface of the p-type semiconductor layer 132p. At this time, the p-type semiconductor layer 132p is etched entirely along the X axis and the Y axis. The semiconductor device 60p2 shown in FIG. 20 includes the p-type semiconductor layer 132p from which the part in the presence of the ion-implanted region 134p has been removed after implementation of process P240 and the surface removal process P245. Processes after the surface removal process P245 are the same as the processes after process P250 according to the manufacturing method of the second embodiment. After implementation of the processes from process P210 to process P240 shown in FIG. 9, the surface removal process P245, and the processes from P250 to process P290 shown in FIG. 9, formation of the semiconductor device 60 in FIG. 19 is finished.

In the semiconductor device 60 manufactured by the foregoing manufacturing method of the sixth embodiment, if the ion-implanted region 134p in the p-type semiconductor layer 132p is damaged by the ion implantation, the damaged part is removed to achieve favorable contact between the metal electrode 140 and the p-type semiconductor layer 130c.

G. Other Embodiments

Figure 21:
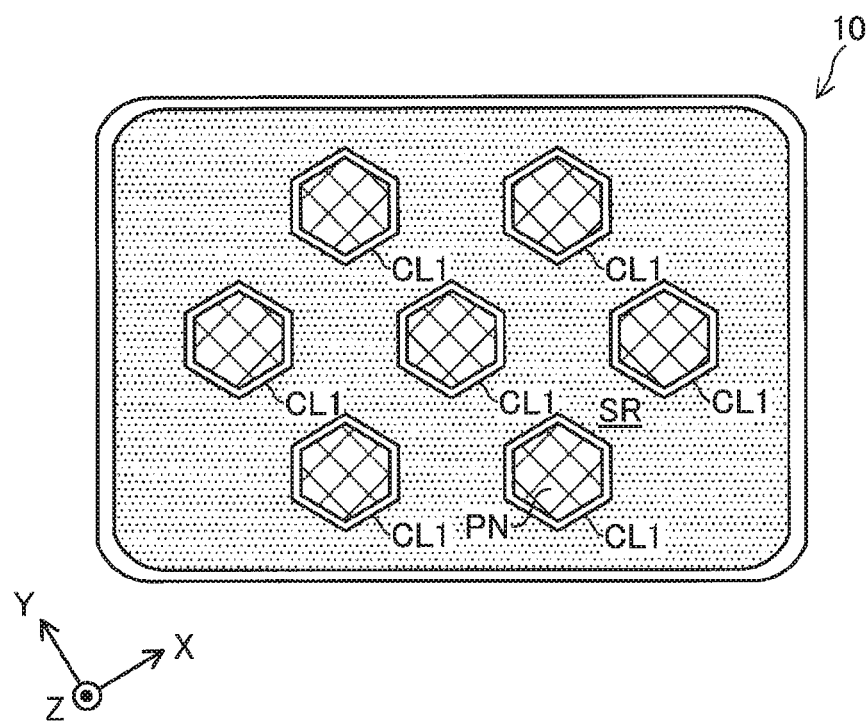

FIG. 21 is a schematic view showing the semiconductor device 10 manufactured by the manufacturing method of the first embodiment from the +Z axis direction. The semiconductor device 10 shown in FIG. 21 has a configuration with multiple cells CL1 having regular hexagonal shapes viewed from the +Z axis direction and aligned regularly in the X axis direction and the Y axis direction. FIG. 21 shows the Schottky region SR and the pn region PN. The shape of a cell in the semiconductor device manufactured by the manufacturing method of each of the foregoing embodiments is not limited to the shape of FIG. 21 but it may be the shape of a cell CL2 or the shape of a cell CL3 in a semiconductor device 10a and a semiconductor device 10b shown in FIGS. 22 and 23 respectively.

Figure 23:
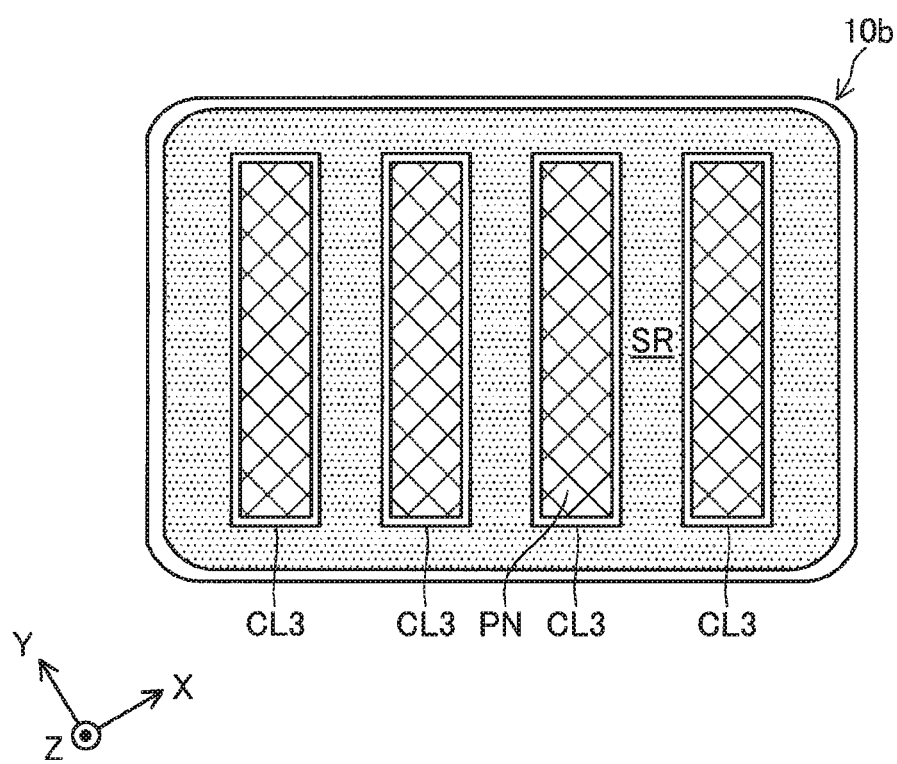
Figure 24:
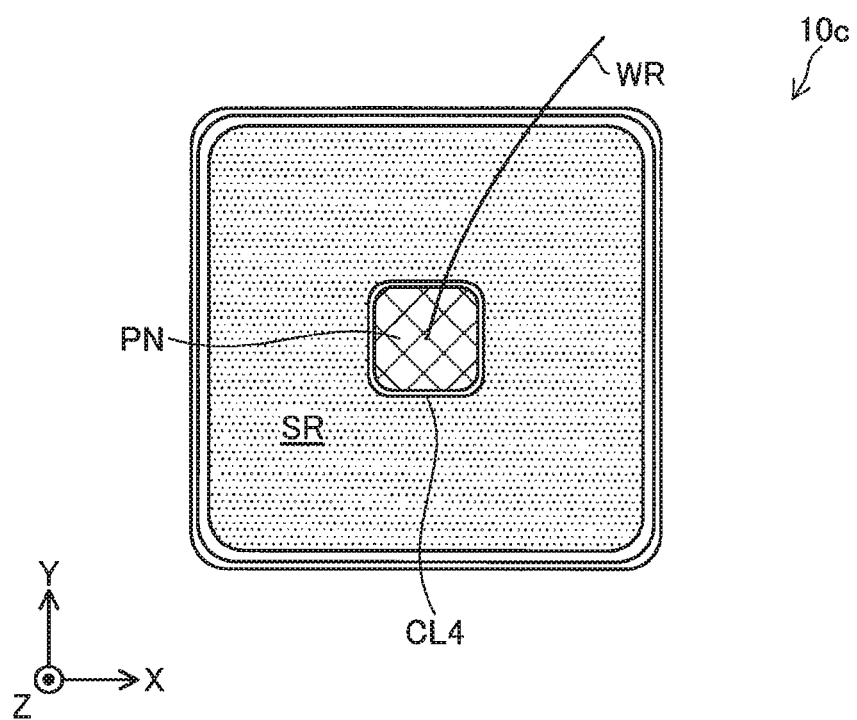
Figure 25:
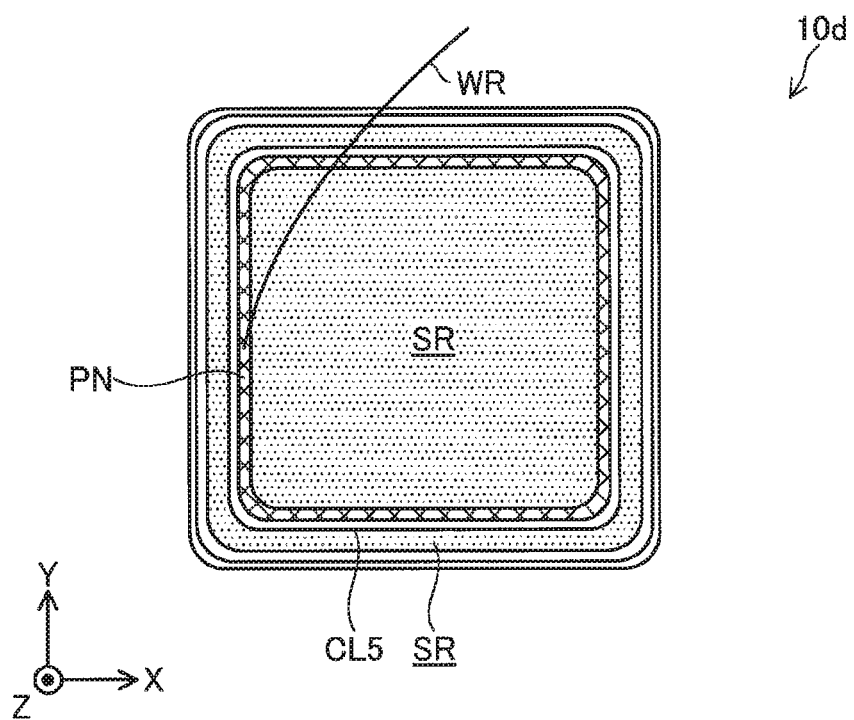
Figure 26:
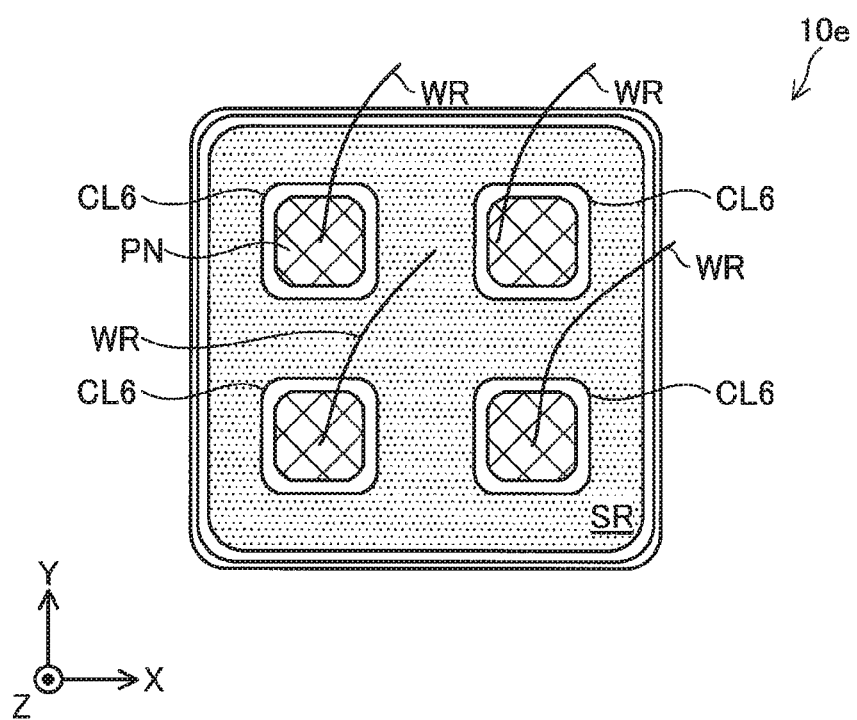

FIGS. 24 to 26 are schematic views of semiconductor devices each having a different cell structure from the structures of the semiconductor devices shown in FIGS. 21 to 23. A semiconductor device 10c, a semiconductor device 10d, and a semiconductor device 10e shown in FIGS. 24 to 26 have a cell CL4, a cell CL5, and a cell CL6 respectively of shapes differing from each other. Wires WR shown in FIGS. 24 to 26 are bonded to the pn regions PN in the cells CL4, CL5, and CL6. As shown in FIGS. 24 to 26, the shape of the pn region PN bonded to the wire WR in the semiconductor device may be changed in response to purpose of use or a condition for mounting, for example. In such embodiments, the pn region is turned on easily in response to flow of a large forward current to allow improvement in forward surge current withstand.

According to the foregoing manufacturing method of the second embodiment, in the n-type semiconductor layer exposure process (process P250), dry etching is performed after the mask 540 is formed on a part of the surface of the p-type semiconductor layer 132p in the ion-implanted range R3. However, the present disclosure is not limited to this. In the n-type semiconductor layer exposure process (process P250), dry etching may be performed after the mask 540 is formed on the surface of the p-type semiconductor layer 132p entirely in the ion-implanted range R3, for example.

According to the foregoing manufacturing method of the first embodiment, in the metal electrode formation process (process P160), the metal electrode 140 is formed by lift-off technique using a resist mask. However, the present disclosure is not limited to this. For example, the metal electrode 140 may be formed by a method of forming a metal electrode on an entire XY plane, then forming a mask pattern using a photoresist, and removing an unnecessary part by a technique such as dry etching, wet etching, or ion milling. The metal electrode 140 may be formed by EB deposition technique, resistance heating deposition technique, or sputtering technique.

Figure 28:
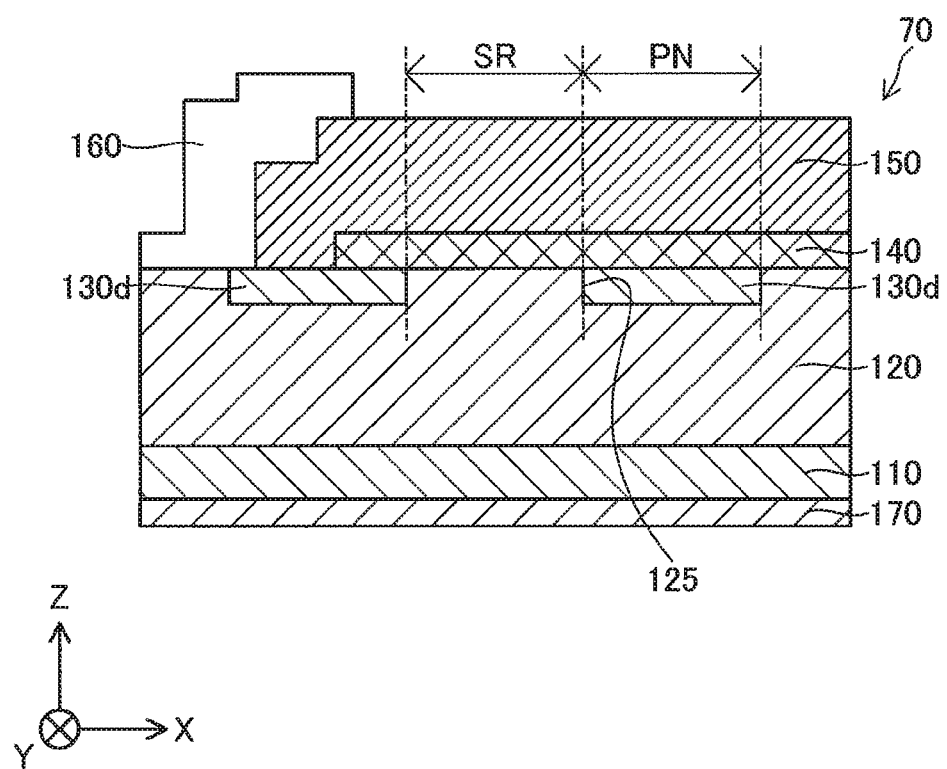
FIG. 28 is a sectional view showing a semiconductor device 70 manufactured by a manufacturing method of one of other embodiments.

FIG. 28 is a sectional view showing a semiconductor device 70 manufactured by a manufacturing method of one of other embodiments. According to the foregoing manufacturing method of the first embodiment (FIG. 2) and the foregoing manufacturing method of the second embodiment (FIG. 9), for example, in the n-type semiconductor layer exposure process (P150, P250), the p-type semiconductor layer 130p or the p-type semiconductor layer 132p is dry etched after formation of the second mask 520 or the mask 540. However, the present disclosure is not limited to this. In the n-type semiconductor layer exposure process, formation of a mask may be omitted, and the p-type semiconductor layer 130p or the p-type semiconductor layer 132p may be dry etched entirely so as to expose the n-type semiconductor layer 120 in the range R2 (shown in FIG. 5) or the n-type semiconductor layer 120 in the range R4 (shown in FIG. 12), for example. For example, the semiconductor device 70 shown in FIG. 28 is manufactured by dry etching the p-type semiconductor layer 130p entirely, without forming mask, so as to expose the n-type semiconductor layer 120 in the range R2 (shown in FIG. 5), instead of the n-type semiconductor layer exposure process P150 in FIG. 2. A mask is not formed in such a manufacturing method to allow simplification of manufacturing processes. In a semiconductor device 70 manufactured by such a manufacturing method, a resultant p-type semiconductor layer 130d does not protrude from the n-type semiconductor layer 120 in the Z-axis direction. Accordingly, the following microfabrication process does not become difficult because of steps of the p-type semiconductor layer. Further, the variation of fabricated shape is reduced. As a result, the manufacturing method makes it possible to avoid risk such as coating failure at a metal electrode.

As described in the fifth embodiment, the width W1 of the lower layer 136 of the p-type semiconductor layer 130b is preferably larger than the width W2 of the upper layer 138 of the p-type semiconductor layer 130b for alleviating electric field crowding (shown in FIG. 18). Accordingly, the size of the width W1 of the p-type semiconductor layer 130b is subject to constraints due to the size of the width W2 of the second mask 550 for forming the upper layer 138 of the p-type semiconductor layer 130b (shown in FIG. 17). In other words, the size of the width W1 of the p-type semiconductor layer 130b is subject to constraints due to the accuracies of photolithography and etching. However, in the embodiment in FIG. 28, the second mask 550 is not used in the production process. Accordingly, the size of the width of the p-type semiconductor layer 130d can be set freely from the constraints due to the accuracies of photolithography and etching. As a result, the size of the width of the p-type semiconductor layer 130b can be set smaller and the features of semiconductor device 70 can be designed more finely.

According to the foregoing manufacturing method of the second embodiment (FIG. 9), magnesium (Mg) is ion-implanted as p-type impurities in the ion implantation process (process P235). However, the present disclosure is not limited to this. Impurities to be ion-implanted in the ion implantation process (process P235) may be nitrogen (N), silicon (Si), or carbon (C), for example. A part including a region with such ion-implanted impurities may be removed by the surface removal process described in the sixth embodiment, and then the n-type semiconductor exposure process (process P250) may be performed.

According to the foregoing manufacturing method of the second embodiment (FIG. 9), the p-type semiconductor layer 132p is formed in the p-type semiconductor layer formation process (process P230). However, the present disclosure is not limited to this. A p-type semiconductor layer formed in the p-type semiconductor layer formation process (process P230) may be a p-type semiconductor layer with a lower layer and an upper layer, for example. A p-type impurity concentration in the upper layer mentioned herein is higher than a p-type impurity concentration in the lower layer. In a semiconductor device manufactured by such a manufacturing method, contact resistance at an interface between a metal electrode and the upper layer (p-type semiconductor layer) is lower than that in a semiconductor device manufactured by the manufacturing method of the second embodiment, allowing a current to flow easily into the pn region in response to application of a voltage in a forward direction (−Z axis direction). In this case, impurities to be ion implanted in the ion implantation process (process P235) may be nitrogen (N), silicon (Si), or carbon (C), for example.

According to the foregoing manufacturing method of the second embodiment (FIG. 9), after formation of the foregoing p-type semiconductor layer with a lower layer and an upper layer in the p-type semiconductor layer formation process (process P230), and after implementation of the ion implantation process (process P235) and then the thermal treatment process (process P240), the surface removal process may be performed before implementation of the n-type semiconductor layer exposure process (process P250). In the surface removal process mentioned herein, the p-type semiconductor layer is etched in the Z-axis direction corresponding to a stacking direction from a surface of the p-type semiconductor layer so as to remove a part in the presence of an ion-implanted region and to leave the upper layer unremoved. In a semiconductor device manufactured by such a manufacturing method, contact resistance at an interface between a metal electrode and the upper layer (p-type semiconductor layer) is low, allowing a current to flow easily into the pn region in response to application of a voltage in a forward direction (−Z axis direction). Additionally, if the ion-implanted region in the p-type semiconductor layer is damaged, the damaged part is removed to achieve favorable contact between the metal electrode and the p-type semiconductor layer.

According to the foregoing third embodiment (FIG. 13), in the p-type semiconductor layer formation process (process P340), the p-type semiconductor layer 130 is formed to extend from the groove 125 to a position closer to the +Z axis direction than the interface between the first mask 510 and the n-type semiconductor layer 120. However, the present disclosure is not limited to this. For example, the p-type semiconductor layer formed in the p-type semiconductor layer formation process (process P340) may be a p-type semiconductor layer with a lower layer and an upper layer. A p-type impurity concentration in the upper layer mentioned herein is higher than a p-type impurity concentration in the lower layer. The lower layer is preferably formed to extend to a position closer to the +Z axis direction than the interface between the first mask 510 and the n-type semiconductor layer 120. In a semiconductor device manufactured by such a manufacturing method, contact resistance at an interface between a metal electrode and the upper layer (p-type semiconductor layer) is low, allowing a current to flow easily into the pn region in response to application of a voltage in a forward direction (−Z axis direction).

Figure 27:
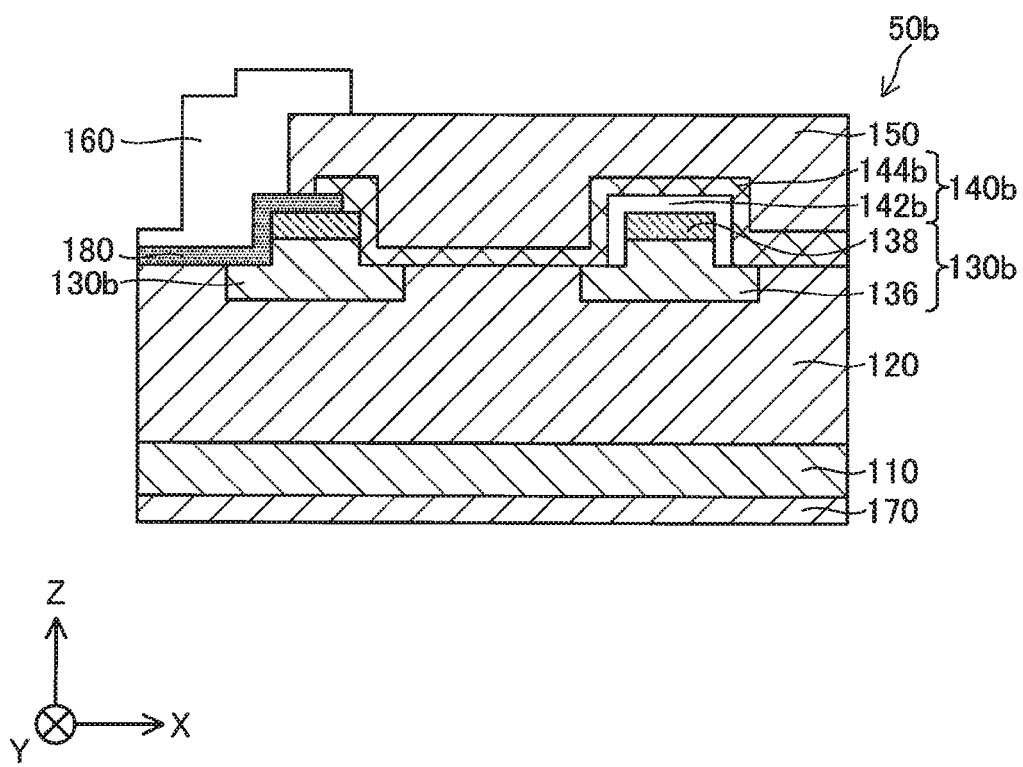
FIG. 27 is a sectional view showing a semiconductor device manufactured by a manufacturing method of a different embodiment.

FIG. 27 is a sectional view schematically showing the configuration of a semiconductor device 50b manufactured by a manufacturing method of a different embodiment. In comparison to the semiconductor device 50 (FIG. 18) manufactured by the foregoing manufacturing method of the fifth embodiment, the semiconductor device 50b includes a metal electrode 140b instead of the metal electrode 140a. The metal electrode 140b includes a first layer 142b and a second layer 144b. The first layer 142b and the second layer 144b have the same configurations as the first layer 142 and the second layer 144 respectively except their shapes. In the semiconductor device 50b, an area of contact between the metal electrode 140b (first layer 142b) and the p-type semiconductor layer 130b is larger than a corresponding contact area in the semiconductor device 50 (FIG. 18) manufactured by the manufacturing method of the fifth embodiment, thereby reducing contact resistance at an interface between the metal electrode 140b (first layer 142b) and the p-type semiconductor layer 130b. This makes it possible to flow a current easily in the pn region in response to application of a voltage in a forward direction (−Z axis direction).

The present disclosure is feasible in the following aspects.

(1) According to one aspect of the present disclosure, a method of manufacturing a semiconductor device is provided. The method of manufacturing the semiconductor device comprises: forming a gallium nitride (GaN) based n-type semiconductor layer containing n-type impurities; forming a groove by forming a first mask on a part of a surface of the n-type semiconductor layer and then etching a part of the n-type semiconductor layer that is uncovered by the first mask; removing the first mask; forming a gallium nitride (GaN) based p-type semiconductor layer containing p-type impurities on the surface of the n-type semiconductor layer including the groove after removal of the first mask; etching the p-type semiconductor layer to expose the n-type semiconductor layer at least in a range differing from a range in the presence of the groove; and forming a metal electrode contacting the n-type semiconductor layer exposed by the etching of the p-type semiconductor layer and the p-type semiconductor layer. According to this aspect, even if etching proceeds more deeply than a position where the n-type semiconductor layer in a part differing from a part in the presence of the groove is exposed, it is still possible to reduce the likelihood of formation of a corner resulting from a recess in a part of the n-type semiconductor layer at a deeper position than the p-type semiconductor layer. This allows reduction in the occurrence of electric field crowding resulting from formation of a corner.

(2) According to a different aspect of the present disclosure, a method of manufacturing a semiconductor device is provided. The method of manufacturing the semiconductor device comprises: forming a gallium nitride (GaN) based n-type semiconductor layer containing n-type impurities; forming a gallium nitride (GaN) based p-type semiconductor layer containing p-type impurities on a surface of the n-type semiconductor layer; ion-implanting impurities from a part of a surface of the p-type semiconductor layer; performing thermal treatment to form an implanted region in which the ion-implanted impurities are activated and to diffuse the p-type impurities in the p-type semiconductor layer into the n-type semiconductor layer below the implanted region, thereby forming a p-type impurity diffusion region; etching the p-type semiconductor layer to expose the n-type semiconductor layer at least in a range differing from a range in the presence of the p-type impurity diffusion region; and forming a metal electrode contacting the n-type semiconductor layer exposed by the etching of the p-type semiconductor layer and the p-type semiconductor layer. According to this aspect, even if etching proceeds more deeply than a position where the n-type semiconductor layer in a range differing from a range in the presence of the p-type impurity diffusion region is exposed, it is still possible to reduce the likelihood of formation of a corner resulting from a recess in a part of the n-type semiconductor layer at a deeper position than the p-type semiconductor layer. This allows reduction in the occurrence of electric field crowding resulting from formation of a corner.

(3) The method of manufacturing the semiconductor device according to the foregoing aspect may further comprise, between the thermal treatment and the etching of the p-type semiconductor layer, etching, in a stacking direction from the surface of the p-type semiconductor layer, at least a part of the p-type semiconductor layer under which the implanted region is formed. In the semiconductor device manufactured by this aspect, if a part of the implanted region in the p-type semiconductor layer is damaged by the ion implantation, the damaged part is removed to achieve favorable contact between the metal electrode and the p-type semiconductor layer.

(4) In the method of manufacturing the semiconductor device according to the foregoing aspect, the ion-implanted impurities may be p-type impurities.

(5) In the method of manufacturing the semiconductor device according to the foregoing aspect, in the etching of the p-type semiconductor layer, a mask may be formed on at least a part of a surface of the p-type semiconductor layer and then the p-type semiconductor layer may be etched.

(6) According to a different aspect of the present disclosure, a method of manufacturing a semiconductor device is provided. The method of manufacturing the semiconductor device comprises: forming a gallium nitride (GaN) based n-type semiconductor layer containing n-type impurities; forming a groove by forming a first mask on a part of a surface of the n-type semiconductor layer and then etching a part uncovered by the first mask; forming a gallium nitride (GaN) based p-type semiconductor layer containing p-type impurities to extend the p-type semiconductor layer from the groove to at least an interface between the n-type semiconductor layer and the first mask; removing the first mask; and forming a metal electrode contacting the n-type semiconductor layer and the p-type semiconductor layer after removal of the first mask. This aspect makes it possible to reduce the likelihood of formation of a corner resulting from a recess in a part of the n-type semiconductor layer at a deeper position than the p-type semiconductor layer. This allows reduction in the occurrence of electric field crowding resulting from formation of a corner.

The aspects of the present disclosure are not limited to the method of manufacturing a he semiconductor device. For example, the present disclosure is feasible as a semiconductor device manufactured by this method, a power converter including the semiconductor device, and others. The present disclosure should never be limited to the foregoing aspects but is certainly feasible in various aspects within a range not deviating from the substance of the present disclosure.

According to present disclosure, even if etching proceeds more deeply than a position where the n-type semiconductor layer in a part differing from a part in the presence of the groove is exposed, it is still possible to reduce the likelihood of formation of a corner resulting from a recess in a part of the n-type semiconductor layer at a deeper position than the p-type semiconductor layer. This allows reduction in the occurrence of electric field crowding resulting from formation of a corner.

The present disclosure should not be limited to the above-described embodiments, examples, or modifications but is feasible in the form of various configurations within a range not deviating from the substance of the disclosure. For example, technical features in the embodiments, those in the examples, or those in the modifications corresponding to those in each of the aspects described above may be replaced or combined, where appropriate, with the intention of solving some or all of the aforementioned problems or achieving some or all of the aforementioned effects. Unless being described as absolute necessities in this specification, these technical features may be deleted, where appropriate.

What is claimed is:
1. A method of manufacturing a semiconductor device, the method comprising:
    forming a gallium nitride (GaN) based n-type semiconductor layer containing n-type impurities;
    forming a groove by forming a first mask on a part of a surface of the n-type semiconductor layer and then etching a part of the n-type semiconductor layer that is uncovered by the first mask;
    removing the first mask;
    forming a gallium nitride (GaN) based p-type semiconductor layer containing p-type impurities on the surface of the n-type semiconductor layer including the groove after removal of the first mask;
    etching the p-type semiconductor layer to edges of the groove to expose the n-type semiconductor layer at least in a range differing from a range in a presence of the groove; and
    forming a metal electrode contacting the n-type semiconductor layer exposed by the etching of the p-type semiconductor layer and the p-type semiconductor layer.

2. A method of manufacturing a semiconductor device, the method comprising:
    forming a gallium nitride (GaN) based n-type semiconductor layer containing n-type impurities;
    forming a gallium nitride (GaN) based p-type semiconductor layer containing p-type impurities on a surface of the n-type semiconductor layer;
    ion-implanting p-type impurities into a part of a surface of the p-type semiconductor layer;
    performing thermal treatment to form an implanted region in which the ion-implanted impurities are activated and to diffuse the p-type impurities in the p-type semiconductor layer into the n-type semiconductor layer below the implanted region, thereby forming a p-type impurity diffusion region;
    etching the p-type semiconductor layer to expose the n-type semiconductor layer at least in a range differing from a range in a presence of the p-type impurity diffusion region; and
    forming a metal electrode contacting the n-type semiconductor layer, exposed by the etching of the p-type semiconductor layer, and the p-type semiconductor layer.

3. The method of manufacturing the semiconductor device according to claim 2, further comprising:
    between the thermal treatment and the etching of the p-type semiconductor layer, etching, in a stacking direction from the surface of the p-type semiconductor layer, at least a part of the p-type semiconductor layer under, which the implanted region is formed.

4. The method of manufacturing the semiconductor device according to claim 2, wherein the ion-implanted impurities include p-type impurities.

5. The method of manufacturing the semiconductor device according to claim 1, wherein, in the etching of the p-type semiconductor layer, a second mask is formed on at least a part of a surface of the p-type semiconductor layer and then the p-type semiconductor layer is etched.

6. The method of manufacturing the semiconductor device according to claim 2, wherein, in the etching of the p-type semiconductor layer, a mask is formed on at least a part of a surface of the p-type semiconductor layer and then the p-type semiconductor layer is etched.

7. A method of manufacturing a semiconductor device, the method comprising:
    forming a gallium nitride (GaN) based n-type semiconductor layer containing n-type impurities;
    forming a groove by forming a mask on a part of a surface of the n-type semiconductor layer and then etching a part uncovered by the mask;
    forming a gallium nitride (GaN) based p-type semiconductor layer containing p-type impurities, to extend the p-type semiconductor layer from the groove to at least an interface between the n-type semiconductor layer and the mask, while the mask remains disposed on another part of the surface of the n-type semiconductor layer;
    removing the mask; and
    forming a metal electrode contacting the n-type semiconductor layer and the p-type semiconductor layer after removal of the mask.

8. The method of manufacturing the semiconductor device according to claim 1, wherein, in a plan view, after the etching of the p-type semiconductor layer, the edges of the groove are aligned with edges of the p-type semiconductor layer.

9. The method of manufacturing the semiconductor device according to claim 1, wherein, in a plan view, after the etching of the p-type semiconductor layer, an entirety of the p-type semiconductor layer is located inside of the groove.

10. The method of manufacturing the semiconductor device according to claim 1, wherein, in a plan view, the edges of the groove are aligned with edges of the metal electrode.

11. The method of manufacturing the semiconductor device according to claim 1, further comprising forming a wiring electrode on the metal electrode and on a surface of the p-type semiconductor layer.

12. The method of manufacturing the semiconductor device according to claim 11, wherein the wiring electrode abuts the metal electrode and the surface of the p-type semiconductor layer.

13. The method of manufacturing the semiconductor device according to claim 11, wherein the wiring electrode and the metal electrode abut the surface of the p-type semiconductor layer.

14. The method of manufacturing the semiconductor device according to claim 2, wherein the metal electrode is disposed on a surface of the p-type impurity diffusion region.

15. The method of manufacturing the semiconductor device according to claim 2, wherein the metal electrode is disposed on a top surface of the p-type semiconductor layer and on side surfaces of the p-type semiconductor layer.

16. The method of manufacturing the semiconductor device according to claim 2, wherein the etching of the p-type semiconductor layer is performed to expose the n-type semiconductor layer in an area outside of the p-type impurity diffusion region.

17. The method of manufacturing the semiconductor device according to claim 2, wherein an entirety of the etching of the p-type semiconductor layer is performed to expose the n-type semiconductor layer in an area outside of the p-type impurity diffusion region.

18. The method of manufacturing the semiconductor device according to claim 2, wherein, after the etching of the p-type semiconductor layer, a width of the implanted region is less than a width of the p-type impurity diffusion region.

19. The method of manufacturing the semiconductor device according to claim 7, wherein, in the forming of the p-type semiconductor layer, the p-type semiconductor layer extends above the interface between the n-type semiconductor layer and the mask.

20. The method of manufacturing the semiconductor device according to claim 7, wherein, in a plan view, in the forming of the p-type semiconductor layer, the p-type semiconductor layer is disposed outside of the mask.

* * * * *